United States Patent
Neto et al.

(10) Patent No.: US 10,911,060 B1
(45) Date of Patent: Feb. 2, 2021

(54) LOW POWER DEVICE FOR HIGH-SPEED TIME-INTERLEAVED SAMPLING

(71) Applicant: Xilinx, Inc., San Jose, CA (US)

(72) Inventors: Pedro W. Neto, Douglas (IE); Ronan Casey, Cork (IE); Declan Carey, Douglas (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/683,854

(22) Filed: Nov. 14, 2019

(51) Int. Cl.
| | |
|---|---|
| H03M 1/00 | (2006.01) |
| H03M 1/46 | (2006.01) |
| G11C 27/02 | (2006.01) |
| H03M 1/06 | (2006.01) |
| H03M 1/16 | (2006.01) |

(52) U.S. Cl.
CPC ............ *H03M 1/468* (2013.01); *G11C 27/02* (2013.01); *H03M 1/002* (2013.01); *H03M 1/0612* (2013.01); *H03M 1/168* (2013.01)

(58) Field of Classification Search
CPC .... H03M 1/468; H03M 1/0612; H03M 1/168; H03M 1/002; G11C 27/02
USPC ........................................................ 341/122
See application file for complete search history.

(56) References Cited

U.S. PATENT DOCUMENTS

| | | | | |
|---|---|---|---|---|
| 5,517,141 A | * | 5/1996 | Abdi ..................... | G11C 27/026 327/306 |
| 5,638,072 A | * | 6/1997 | Van Auken ........... | H03M 1/804 341/141 |
| 7,944,379 B2 | | 5/2011 | Ohnhaeuser et al. | |
| 8,283,966 B2 | * | 10/2012 | Liu ........................ | G06G 7/184 327/337 |
| 8,390,374 B2 | * | 3/2013 | Alexander .......... | H03F 3/45475 330/69 |
| 8,390,501 B2 | | 3/2013 | Chang et al. | |

(Continued)

OTHER PUBLICATIONS

D. Sculley, EECS Tufts.edu, OpAmps, OpAmps7, URL https://www.eecs.tufts.edu/~dsculley/tutorial/opamps/opamps7.html, retrieved May 25, 2020. Index date Jul. 2004 (Year: 2004).*

(Continued)

*Primary Examiner* — Jean B Jeanglaude
(74) *Attorney, Agent, or Firm* — Patterson + Sheridan, LLP

(57) ABSTRACT

Apparatus and associated methods relate to a time-interleaved integrating sampling front-end circuit using integrating buffers. In an illustrative example, a circuit may include N sampling layers of circuits, an $i^{th}$ sampling layer of circuits of the N sampling layers of circuits may include: (a) $X_i$ buffers configured to receive an analog signal, $X_i \geq 1$, and, (b) $Y_i$ track-and-hold circuits, each track-and-hold circuit of the $Y_i$ track-and-hold circuits is coupled to an output of a corresponding buffer of the X buffers, $Y_i \geq 1$, at least one buffer of the $X_i$ buffers may include an integrating buffer, $N \geq i \geq 1$. By implementing integrating buffers, a faster linear type of step settling response may be obtained as opposed to a slower exponential type of settling response.

20 Claims, 12 Drawing Sheets

(56) References Cited

U.S. PATENT DOCUMENTS

| | | | | |
|---|---|---|---|---|
| 8,611,483 | B2* | 12/2013 | Zhu | H04L 7/0334 375/349 |
| 8,970,419 | B2 | 3/2015 | Farley et al. | |
| 9,356,593 | B2* | 5/2016 | Pan | H03M 1/38 |
| 9,503,058 | B1 | 11/2016 | Cical et al. | |
| 9,509,292 | B2* | 11/2016 | Elias | G09G 3/3648 |
| 9,960,764 | B2* | 5/2018 | Kinzer | H02M 1/36 |
| 10,218,372 | B1 | 2/2019 | Farley et al. | |
| 10,236,901 | B1 | 3/2019 | Neto | |
| 10,333,394 | B2* | 6/2019 | Awad | H03F 3/3069 |
| 10,361,690 | B1* | 7/2019 | Addepalli | G11C 29/028 |
| 10,480,970 | B2* | 11/2019 | Li | H03M 1/12 |
| 2009/0237117 | A1* | 9/2009 | McLeod | H03F 3/45 327/50 |
| 2009/0261907 | A1* | 10/2009 | Tam | H03F 1/14 330/292 |
| 2013/0194021 | A1* | 8/2013 | Scandiuzzo | H03K 19/018521 327/333 |
| 2014/0049291 | A1* | 2/2014 | Soh | H04N 5/378 327/94 |

OTHER PUBLICATIONS

Intersil Application Note AN517, Applications of Monolithic Sample and Hold Amplifiers, Aug. 2005.*

Bob Verbruggen, Masao Iriguchi, and Jan Craninckx, A 1.7 mW 11b 250 MS/s 2-Times Interleaved Fully Dynamic Pipelined SAR ADC in 40 nm Digital CMOS, IEEE Journal of Solid-State Circuits, Dec. 2012, 8 pages, vol. 47, No. 12, San Francisco, CA, USA.

Young-Deuk Jeon, Young-Kyun Cho, Jae-Won Nam, Kwi-Dong Kim, Woo-Yol Lee, Kuk-Tae Hong, and Jong-Kee Kwon, A 9.15mW 0.22mm2 10b 204MS/s Pipelined SAR ADC in 65nm CMOS, IEEE, 2010, 4 pages, San Jose, CA, USA.

Chun-Cheng Liu, Soon-Jyh Chang, Guan-Ying Huang, and Ying-Zu Lin, A 10-bit 50-MS/s SAR ADC With a Monotonic Capacitor Switching Procedure, IEEE Journal of Solid-State Circuits, Apr. 2010, 10 Pages, vol. 45, No. 4, USA.

Samuel Palermo, Sebastian Hoyos, Ayman Shafik, Ehsan Zhian Tabasy, Shengchang Cai, Shiva Kiran, and Keytaek Lee, CMOS ADC-Based Receivers for High-Speed Electrical and Optical Links, IEEE Communications Magazine, Oct. 2016, 8 pages, USA.

Jen-Huan Tsai, Hui-Huan Wang, Yang-Chi Yen, Chang-Ming Lai, Yen-Ju Chen, Po-Chuin Huang, Ping-Hsuan Hsieh, Hsin Chen, and Chao-Cheng Lee, A 0.003 mm2 10 b 240 MS/s 0.7 mW SAR ADC in 28 nm CMOS With Digital Error Correction and Correlated-Reversed Switching, IEEE Journal of Solid-State Circuits, Jun. 2015, 17 pages, vol. 50, No. 6, USA.

Kalmeshwar N. Hosur, Girish V. Attimarad, Harish M. Kittur, and S. S. Kerur, Design and simulation of Low Power Successive Approximation Register for A/D Converters using 0.18um CMOS Technology, International Journal of Engineering and Technology (IJET), May 2016, 9 pages, vol. 8, No. 2, India.

Lukas Kull, Thomas Toifl, Martin Schmatz, Pier Andrea Francese, Christian Menolfi, Matthias Braendli, Marcel Kossel, Thomas Morf, Toke Meyer Andersen, and Yusuf Leblebici, A 3.1 mW 8b 1.2 GS/s Single-Channel Asynchronous SAR ADC With Alternate Comparators for Enhanced Speed in 32 nm Digital SOI CMOS, IEEE Journal of Solid-State Circuits, Dec. 2013, 10 pages, vol. 48, No. 12.

Lukas Kull, Thomas Toifl, Martin Schmatz, Pier Andrea Francese, Christian Menolfi, Matthias Braendli, Marcel Kossel, Thomas Morf, Toke Meyer Andersen, Yusuf Leblebici, A 90GS/s 8b 667mW 64× Interleaved SAR ADC in 32nm Digital SOI CMOS, 2014 IEEE International Solid-State Circuits Conference, 3 pages, San Francisco, CA.

M. Ei-Chammas, B. Murmann, Background Calibration of Time-Interleaved Data Converters, Analog Circuits and Signal Processing, chapter 2, <retrieved online> DOI 10.1007/978-1-4614-1511-4 2, 2012.

Yohan Frans, Mohanmed Elzeftawi, Hiva Hedayati, Jay Im, Vassili Kireev, Toan Pham, Jaewook Shin, Parag Upadhyaya, Lei Zhou, Santiago Asuncion, Chris Borrelli, Geoff Zhang, Hongtao Zhang, Ken Chang, A 56Gb/s PAM4 Wireline Transceiver using a 32-way Time-Interleaved SAR ADC in 16nm FinFET, 2016 Symposium on VLSI Circuits Digest of Technical Papers, 2 pages, 2016.

James Hudner, Declan Carey, Ronan Casey, Kay Hearne, Pedro Wilson De Abreu Farias Neto, Ilias Chlis, Marc Erett, Chi Fung Poon, Asma Laraba, Hongtao Zhang, Sai Lalith Chaitanya Ambatipudi, David Mahashin, Parag Upadhyaya, Yohan Frans, Ken Chang, A 112Gb/s PAM4 Wireline Receiver using a 64-way Time-Interleaved SAR ADC in 16nm FinFET, 2018 Symposium on VLSI Circuits Digest of Technical Papers, 2 pages, 2018.

E-Hung Chen, Ramy Yousry, Chih-Kong Ken Yang, Power Optimized ADC-Based Serial Link Receiver, IEEE Journal of Solid-State Circuits, vol. 47, No. 4, Apr. 2012, 14 pages.

* cited by examiner

LOW POWER DEVICE FOR HIGH-SPEED TIME-INTERLEAVED SAMPLING

TECHNICAL FIELD

Various embodiments relate generally to integrated circuits (ICs), and more specifically, to analog-to-digital converters (ADCs).

BACKGROUND

Communication systems transport data from a transmitter to a receiver over a data link. Before transmission, data may be encoded in analog or digital formats. Some communication systems may modulate a carrier signal to carry the data information from the transmitter to the receiver. At the receiver, data may be recovered by demodulating the received signal.

Data links that transport data may be wired or wireless. Wired communication systems may include telephone networks, cable television, internet service provider, and fiber-optic communication nodes, for example. Wireless data links may transfer information between two or more points that are not connected by an electrical conductor. Wireless data links may transport data by using electromagnetic waves propagating through a medium, such as air or free space.

At a receiver in a digital communication system, a digitally-encoded data stream may be received as an analog signal and converted to a digital format by an analog-to-digital converter (ADC). The ADC interprets the data stream as a function of time. For example, some ADCs may be synchronized to a clock signal that determines when a voltage signal is to be sampled.

SUMMARY

Apparatus and associated methods relate to a time-interleaved integrating sampling front-end circuit using integrating buffers. In an illustrative example, a circuit may include N sampling layers of circuits, an $i^{th}$ sampling layer of circuits of the N sampling layers of circuits may include: (a) $X_i$ buffers configured to receive an analog signal, $X_i \geq 1$, and, (b) $Y_i$ track-and-hold circuits, each track-and-hold circuit of the $Y_i$ track-and-hold circuits is coupled to an output of a corresponding buffer of the X buffers, $Y_i \geq 1$, at least one buffer of the $X_i$ buffers may include an integrating buffer, $N \geq i \geq 1$. By implementing integrating buffers, a faster linear type of step settling response may be obtained as opposed to a slower exponential type of settling response.

Various embodiments may achieve one or more advantages. For example, by using integrating buffers, some embodiments may provide an analog-to-digital converter (ADC) with a relaxed required bandwidth by more than 5 times and the power consumption of the ADC may be reduced to less than 30%, keeping the same footprint. In some embodiments, the ADCs that implement the integrating buffers may be used for high-speed applications (e.g., Serializer-Deserializer (SerDes) applications, field programmable gate array (FPGA) input/output (IO) applications, optical transceiver applications, 5G technologies). In some embodiments, time-interleaved ADCs may be used to improve the data throughput or power for a given data throughput of a receiver. Some embodiments may use integrating buffers that includes gated transconductors, and the operation of the gated transconductors may be controlled by corresponding controlling signals. Some embodiments may use integrating buffers to perform integrations and obtain the linear settling response. In some embodiments, sampling sequences and clock signals used to control the samplings may be designed to reduce interferences between samples.

In an exemplary aspect, a circuit includes N sampling layers of circuits, $N \geq 1$, an $i^{th}$ sampling layer of circuits of the N sampling layers of circuits includes: (a) $X_i$ buffers configured to receive an analog signal, $X_i \geq 1$, and, (b) $Y_i$ track-and-hold circuits coupled to an output of a corresponding buffer of the $X_i$ buffers, $Y_i \geq 1$, at least one buffer of the $X_i$ buffers comprises an integrating buffer.

In some embodiments, the integrating buffer may include a transconductor. In some embodiments, all buffers of the $X_i$ buffers in one sampling layer of circuits may be a same type of integrating buffer. In some embodiments, the integrating buffer may include a transconductor and a resettable capacitor, the output of the transconductor is coupled to one terminal of the resettable capacitor, and the other terminal of the resettable capacitor is coupled to a finite impedance voltage source. In some embodiments, the analog input signal may be a differential signal.

In another exemplary aspect, a circuit includes a first sampling layer of circuits. The first sampling layer of circuits includes (a) M buffers configured to receive an analog input signal, and (b) M sets of switches, each set of the M sets of switches includes K switches, $M \geq 1$, $K \geq 1$. Each switch in a corresponding set of the M sets of switches is coupled is coupled to a corresponding buffer of the M buffers, and at least one buffer of the M buffers comprises an integrating buffer.

In some embodiments, the integrating buffer may include a transconductor. In some embodiments, all buffers of the M buffers in the first sampling layer of circuits may be a same type of integrating buffer. In some embodiments, the integrating buffer may include a transconductor and a resettable capacitor, the output of the transconductor is coupled to one terminal of the resettable capacitor, and the other terminal of the resettable capacitor is coupled to a finite impedance voltage source. In some embodiments, the first sampling layer of circuits may also include KIM capacitors, each capacitor of the KIM capacitors may be connected to a corresponding switch of the M sets of switches in parallel to form a corresponding resettable capacitor. In some embodiments, the first sampling layer of circuits may also include KIM capacitors, each capacitor of the KIM capacitors may be connected to a corresponding switch of the M sets of switches in series to form a corresponding track-and-hold circuit.

In some embodiments, the circuit may also include a second sampling layer of circuits. The second sampling layer of circuits may include K*M buffers, each buffer of the KIM buffers may be coupled to a corresponding switch of the M sets of switches in the first sampling layer of circuits. In some embodiments, the second sampling layer of circuits (Rank 2) may also include KIM capacitors, each capacitor of the K*M capacitors may be connected to a corresponding switch of the M sets of switches in parallel to form a corresponding resettable capacitor. In some embodiments, the one or more buffers of K*M buffers may include a transconductor. In some embodiments, the circuit may also include K*M*N sub-analog-to-digital converters, each N sub-ADCs of the K*M*N sub-ADCs may be commonly connected to a corresponding buffer of the KIM buffers, N 1. In some embodiments, the analog input signal may be a differential signal.

In another exemplary aspect, a method includes (a) providing a first sampling layer of circuits having M buffers and M sets of switches, each set of the M sets of switches includes K switches; (b) configuring each buffer of the M buffers to receive an analog input signal; and, (c) coupling each switch in a corresponding set of the M sets of switches to a corresponding buffer of the M buffers, M≥1, K≥1, at least one buffer of the M buffers include an integrating buffer.

In some embodiments, the integrating buffer may include a transconductor. In some embodiments, the integrating buffer may include a gated transconductor. In some embodiments, the integrating buffer may include a transconductor and a resettable capacitor, the output of the transconductor is coupled to one terminal of the resettable capacitor, and the other terminal of the resettable capacitor is coupled to a finite impedance voltage source. In some embodiments, the method may also include providing K*M capacitors and connecting each capacitor of the K*M capacitors to a corresponding switch of the M sets of switches in parallel to form a corresponding resettable capacitor.

In some embodiments, the method may also include providing K*M capacitors and connecting each capacitor of the KIM capacitors to a corresponding switch of the M sets of switches in series to form a corresponding track-and-hold circuit. In some embodiments, the method may also include providing a second sampling layer of circuits having KIM buffers and coupling each buffer of the K*M buffers to a corresponding switch of the M sets of switches in the first sampling layer of circuits.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to a time-interleaved integrating sampling front-end circuit using integrating buffers. In an illustrative example, a circuit may include N sampling layers of circuits, an $i^{th}$ sampling layer of circuits of the N sampling layers of circuits may include: (a) $X_i$ buffers configured to receive an analog signal, $X_i \geq 1$, and, (b) $Y_i$ track-and-hold circuits, each track-and-hold circuit of the $Y_i$ track-and-hold circuits is coupled to an output of a corresponding buffer of the X buffers, $Y_i \geq 1$, at least one buffer of the $X_i$ buffers may include an integrating buffer, $N \geq i \geq 1$. By implementing integrating buffers, a faster linear type of step settling response may be obtained as opposed to a slower exponential type of settling response.

To aid understanding, this document is organized as follows. First, an exemplary platform (e.g., FPGA) suitable to perform data communication and signal conversion is briefly introduced with reference to FIG. 1. Second, with reference to FIGS. 2A-2B, the discussion turns to exemplary embodiments that illustrate an integrating sampling front-end circuit having integrating buffers in an analog-to-digital converter (ADC). Then, with reference to FIGS. 3A-4B, exemplary architectures used to form an integrating buffer (e.g., tranconductor, gated transconductor, gated resettable transconductor) are discussed. Then, with reference to FIGS. 5-9, generalized structures of exemplary integrating sampling front-end circuits and methods to implement generalized integrating sampling front-end circuits are discussed. Finally, with reference to FIG. 10, another exemplary platform (e.g., SOC) suitable to perform data communication and signal conversion is briefly introduced.

Figure 1:
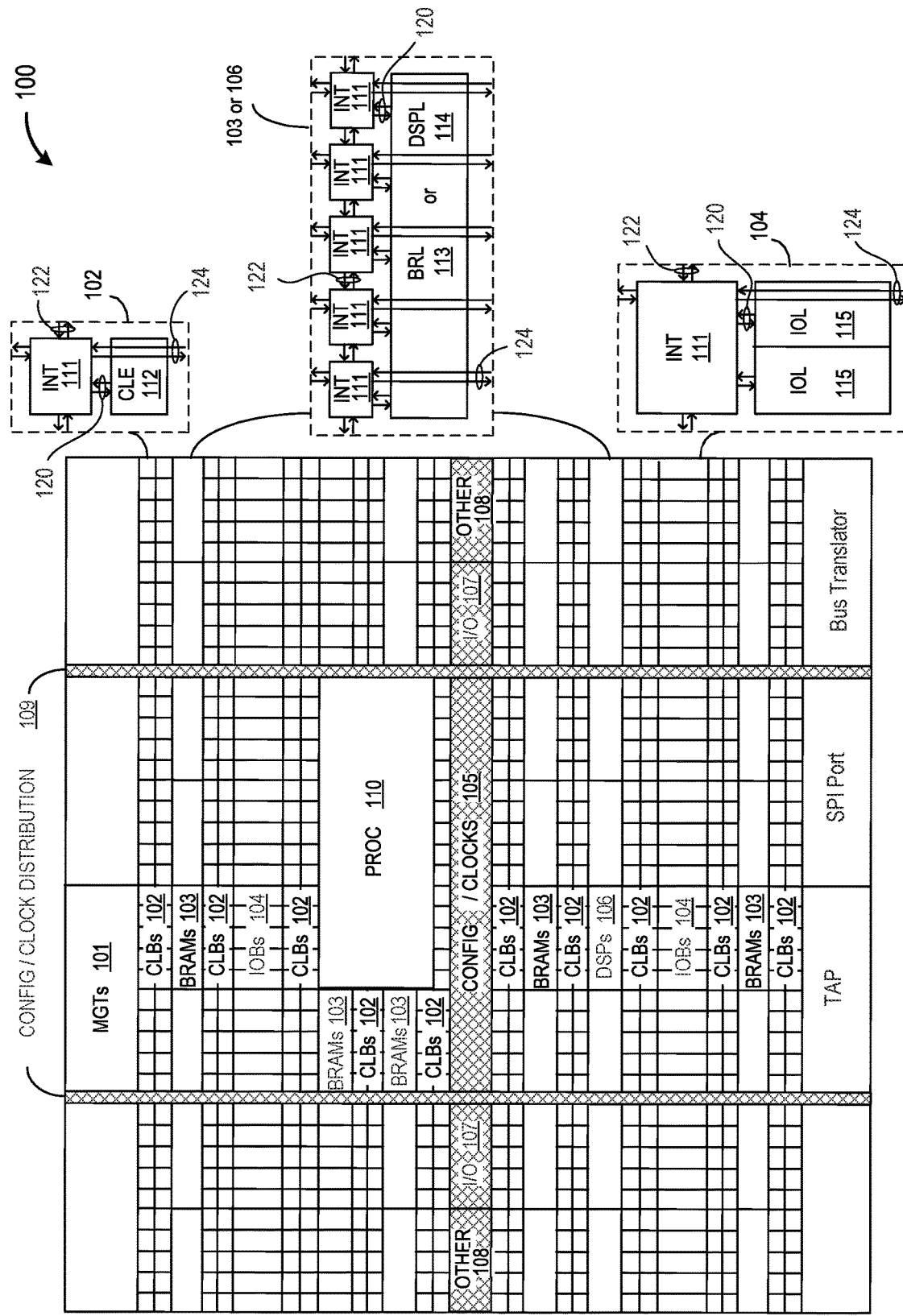
FIG. 1 depicts an exemplary programmable integrated circuit (IC) on which the disclosed circuits, methods and processes may be implemented.

FIG. 1 depicts an exemplary programmable integrated circuit (IC) on which the disclosed circuits, methods and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Integrated circuits (IC) (e.g., FPGA)), such as the programmable IC 100, for example, may be used in a communication system to support various data communication protocols over wide frequency ranges while using progressively smaller areas. In various examples, analog signal levels may be converted into digital voltages, digital currents or digital charge signals using an analog-to-digital converter (ADC). Successive-approximation-register (SAR) ADC is a type of ADC that may convert a continuous analog waveform into a discrete digital representation via, for example, a binary search, through possible quantization levels before finally converging upon a digital output for each conversion.

Figure 2A:
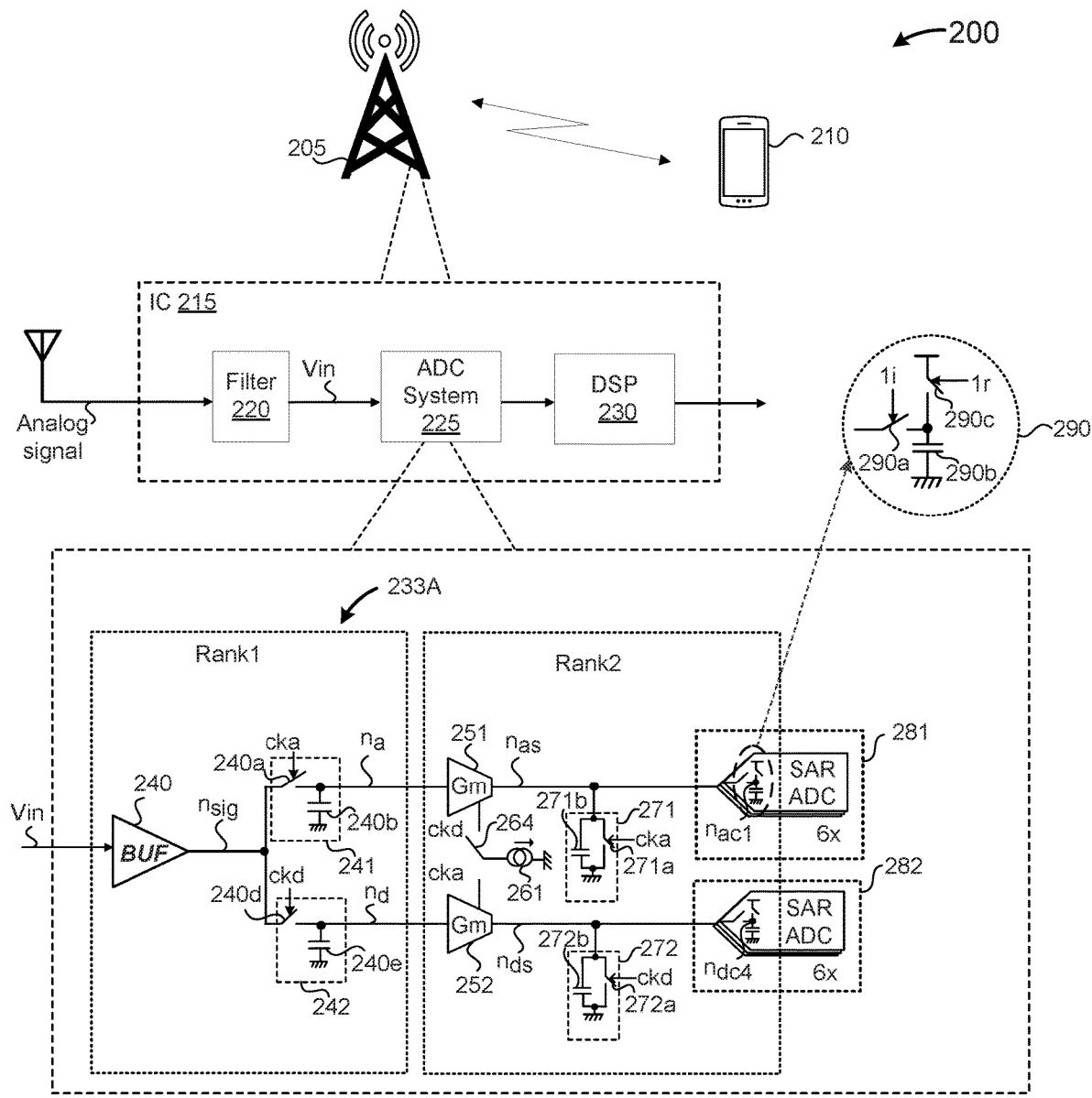
FIG. 2A depicts an exemplary time-interleaved (TI) analog-to-digital converter (ADC) with an integrating sampling front-end circuit implemented in the IC.

FIG. 2A depicts an exemplary time-interleaved (TI) analog-to-digital converter (ADC) with an integrating sampling front-end circuit implemented in the IC. In this depicted example, a communication system 200 includes a base station 205 to transmit and/or receive data from some data communication devices. In this example, the base station 205 receives an analog signal from a portable communication device 210 (e.g., cell phone). The base station 205 includes an integrated circuit (IC) 215 to perform data communications through an antenna (not shown) between the base station 205 and the cell phone 210. For example, IC 215 includes a filter (e.g., a low-pass filter) 220 to filter noises in the analog signal. An analog-to-digital converter (ADC) system 225 may sample and convert the filtered analog signal Vin into a digital signal. The sampling and conversion may be controlled by different clock signals. The digital signal may be then processed by a digital signal processor (DSP) 230, for example.

The time interleaving may be performed through a succession of multiple hierarchical layers arranged as a tree structure, where endpoints on each one of the final branches may be subADCs. In this depicted example, the ADC system 225 includes a two-layer sampling front-end circuit 233A. A first sampling layer of circuits Rank 1 of the sampling front-end circuit 233A includes, for example, a voltage buffer 240. The voltage buffer 240 is coupled to receive the filtered analog signal Vin and generate a continuous time buffered signal $n_{sig}$. The first sampling layer of circuits Rank 1 also includes, for example, a first group of switches 240a, and 240d. The first group of switches 240a and 240d are coupled to the output of the voltage buffer 240. Each of the first group of switches 240a and 240d is controlled by a corresponding clock signal cka and ckd, respectively. The first sampling layer of circuits Rank 1 also includes, a first group of capacitors 240b and 240e. One terminal of each capacitor in the first group of capacitors 240b and 240e is connected to a corresponding switch in the first group of switches, the other terminal of each capacitor in the first group of capacitors 240b and 240e is connected to a finite impedance voltage source (shown as ground in this example). The corresponding switch and the corresponding capacitor form a track- and hold-circuit. For example, the switch 240a and the capacitor 240b form a track-and-hold circuit 241, and the switch 240d and the capacitor 240e form a track-and-hold circuit 242.

A second sampling layer of circuits Rank 2 of the sampling front-end circuit 233A includes, for example, two transconductors 251 and 252. Each of the two transconductors 251 and 252 is coupled to the output of a corresponding switch of the two switches 240a and 240d, respectively. In some embodiments, the second sampling layer of circuits Rank 2 may also include, for example, a current sources 261 and a switch 264. The current source 261 may be arranged between the two adjacent transconductors 251 and 252. One terminal of the current source 261 may be coupled to a reference voltage (e.g., ground), and the other terminal of the current source 261 may be coupled to switch 264. The current source 261 may be connected to the transconductor 251 under the control of the clock signal ckd, and the current source 261 may also be connected to the transconductor 252 under the control of the clock signal cka through the switch 264.

The second sampling layer of circuits Rank 2 also includes a second group of switches 271a and 272a. Each switch of the second group of switches 271a and 272a is coupled to the output of a corresponding transconductor 251 and 252, and each switch of the second group of switches 271a and 272a is controlled by a corresponding clock signal cka and ckd. The other terminal of each switch of the second group of switches 271a and 272a is coupled to a supply voltage. In some embodiments, switches in the same sampling path may be controlled by different clock signals. For example, the switch 271a and the switch 240a may be controlled by different clock signals. The second sampling layer of circuits Rank 2 also includes, a second group of capacitors 271b and 272b. Each capacitor in the second group of capacitors 271b and 272b is connected to a corresponding switch in the second group of switches in parallel. The parallel connected corresponding switch and capacitor form a resettable capacitor. For example, the switch 271a and the capacitor 271b form a resettable capacitor 271, and the switch 272a and the capacitor 272b form a resettable capacitor 272. Each capacitor in the second group of capacitors 271b and 272b is also connected to a corresponding transconductor of the two transconductors 251 and 252. The transconductor (e.g., transconductor 251, 252) followed by a capacitive load (e.g., capacitor 271b-272b in the resettable capacitors 271-272) may form an integrating buffer. In this depicted example, the second sampling layer of circuits Rank 2 include two integrating buffers formed by formed by the transconductor 251 and the capacitor 271b, and the transconductor 252 and the capacitor 271b, respectively. The integrating buffer, including a transconductor and a capacitive load, is a voltage-to-current buffer, rather than a voltage buffer. The structure and characteristics of different transconductors are described in further detail with reference to FIGS. 3A-3B. An exemplary integrating buffer that includes an exemplary transconductor is described in further detail with reference to FIGS. 4A-4B4B.

In this depicted example, the ADC system 225 also includes 12 time-interleaved sub-ADCs connected to the sampling front-end circuit 233A. Every six sub-ADCs are controlled by a corresponding sampling and hold path. Each transconductor of the two transconductors 251 and 252 is also followed by six sub-ADCs of the 12 sub-ADCs. For example, six sub-ADCs in a subsystem 281 is connected to the output of the transconductor 251. Each sub-ADC also includes a resettable track-and-hold circuit. For example, a first sub-ADC includes a resettable track-and-hold circuit 290. The resettable track-and-hold circuit 290 includes a first integration switch 290a. One terminal of the first integration switch 290a is coupled to the transconductor 251, the other terminal of the first integration switch 290a is coupled to one terminal of a capacitor 290b. The other terminal of the capacitor 290b is coupled to, for example, ground. The resettable track-and-hold circuit 290 also includes a first reset switch 290c. One terminal of the first reset switch 290c is coupled to the other terminal of the first integration switch 290a, and the other terminal of the first reset switch 290c is coupled to a power supply, for example. The resettable track-and-hold circuits (e.g., the resettable track-and-hold circuit 290) may be controlled by a first integration signal $1i$ and a first reset signal $1r$. The first integration switch 290a may be controlled by the first integration signal $1i$ and the first reset switch 290c may be controlled by the first reset signal $1r$. The combination of the first integration switch 290a and the capacitor 290b may be defined as a regular track-and-hold circuit.

The filtered analog signal Vin is received by the buffers in the two-layer sampling structure and is then sampled by the 12 time-interleaved sub-ADCs. Each subsystem of the sub-systems 281-282 is driven by a different clock signal. Two adjacent subsystems (e.g., the subsystems 281-282) are driven by two anti-phase clock signals. For example, the first clock signal cka used by the first subsystem 281 may have a 0-degree phase difference compared to a reference clock signal. The clock signal ckd used by the subsystem 282 may have a 180-degree phase difference compared to the reference clock signal. As the clock signal cka and ckd are anti-phased, interferences between two samples may be advantageously reduced. In some embodiments, the filtered analog signal Vin may be a differential signal, and all or part of the sampling front-end circuit 233A may be differential to receive and sample the differential signal Vin. For example, the transconductors may be differential transconductors. In some embodiments, all or part of the sampling front-end circuit 233A may be single-ended to receive and sample the signal Vin.

The generated continuous time buffered signal $n_{sig}$ is integrated by the integrating buffers in Rank 2. More specifically, the a first integrating buffer receives signal $n_a$ and generates a first buffered signal $n_{as}$, a second integrating buffer receives signal $n_d$ and generates a second buffered signal $n_{ds}$. The signals $n_a$ and $n_d$ are received by corresponding SAR ADCs in their corresponding subsystems 281, 282, respectively. In the first subsystem 281, a resettable track-and-hold circuit (e.g., the resettable track-and-hold circuit 290) of the first sub-ADC within the subsystem 281 receives the signal $n_{as}$ and generates a tracked signal $n_{ac1}$. The tracked signal $n_{ac1}$ may be then converted to a digital signal by the first sub-ADC. In the second subsystem 282, a resettable track-and-hold circuit of a fourth sub-ADC receives the signal $n_{ds}$ and generates a tracked signal $n_{dc4}$. The tracked signal $n_{dc4}$ may be then converted to a digital signal by the fourth sub-ADC.

The sub-ADC reset happens during the tracking phase of the first sampling layer of circuits Rank 1, and during reset phase, a resettable track-and-hold switch (e.g., integration switch 290a) is off, and the reset switch (e.g. the reset switch 290c) is on. The integration happens during the hold phase of the first sampling layer of circuits Rank 1, and a resettable track-and-hold switch (e.g., the integration switch 290a) is on. In some embodiments, only one sub-ADC input in a particular subsystem (e.g., subsystem 281-286) may be integrated at a time. For example, before the integration, during the reset phase, the track-and-hold switch (e.g., the integration switch 290a) in the sub-ADC may be off, the reset switch (e.g., the reset switch 290c) may be on and the internal voltage may be reset to a predefined common mode voltage. After the integration, the track-and-hold switch may be off, and the internal voltage may be held until the next reset phase. Timing diagrams of exemplary clock signals and voltage signals of the sampling front-end circuit are described in detail with reference to FIG. 2B. By using the integrating buffers in the sampling front-end circuit, a faster settling response with "linear" settling characteristic may be obtained, and the required bandwidth may be relaxed, and the power may be reduced while keeping the same footprint.

Figure 2B:
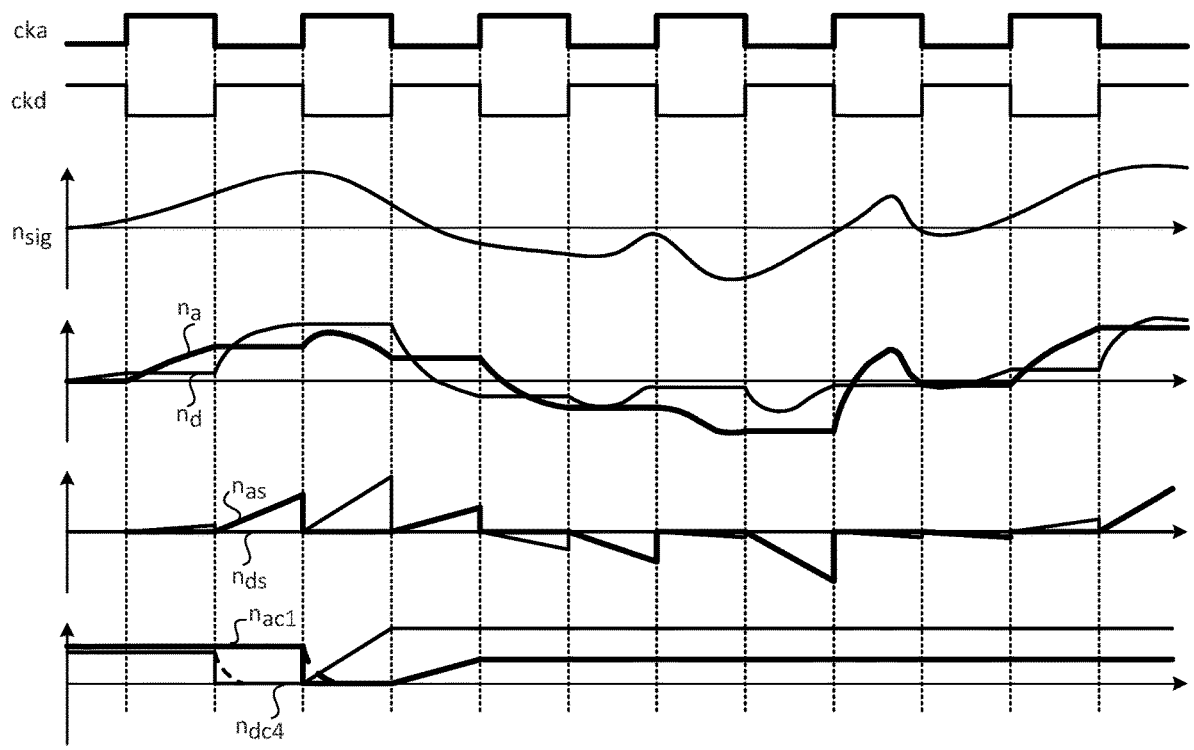
FIG. 2B depicts timing diagrams of exemplary clock signals and voltage signals of the integrating sampling front-end circuit described with reference to FIG. 2A.

FIG. 2B depicts timing diagrams of exemplary clock signals and voltage signals of the integrating sampling front-end circuit described with reference to FIG. 2A. As shown in FIG. 2B, clock signal cka and clock signal ckd are in anti-phase. An exemplary buffered signal $n_{sig}$ generated by the voltage buffer 240 is shown. The voltage signals $n_a$ and $n_d$ in the first sampling path and in the second sampling path are also shown. Then, outputs (e.g., $n_{as}$, $n_{ds}$) of the integrating buffers (e.g., the first integrating buffer formed by the transconductor 251 and the capacitor 271b, and the second integrating buffer formed by the transconductor 252 and the capacitor 272b) are generated. For example, the first integrating buffer may start integrating the signal $n_a$ at a falling edge of the clock signal cka and generating the signal $n_{as}$, the integration may be ended and reset to a low impedance common mode voltage (shown as ground in this example) at a next rising edge of the clock signal cka. The second integrating buffer may start integrating the signal $n_d$ at a falling edge of the clock signal ckd and generating the signal $n_{ds}$, the integration may be ended and reset to a low impedance common mode voltage (shown as ground in this example) at a next falling edge of the clock signal ckd (e.g., rising edge of the clock signal cka). The outputs ($n_{ac1}$, $n_{dc4}$) of exemplary resettable track-and-hold circuits in the sub-ADCs are also shown. The signal $n_{ac1}$ is internal to one sub-ADC (e.g., the first sub-ADC in the subsystem 281). By using the integrating buffer, linearly settling voltage step response may be obtained, thus, high-speed implementations with less power consumption of the ADC system 225 may be obtained.

Figure 3A:
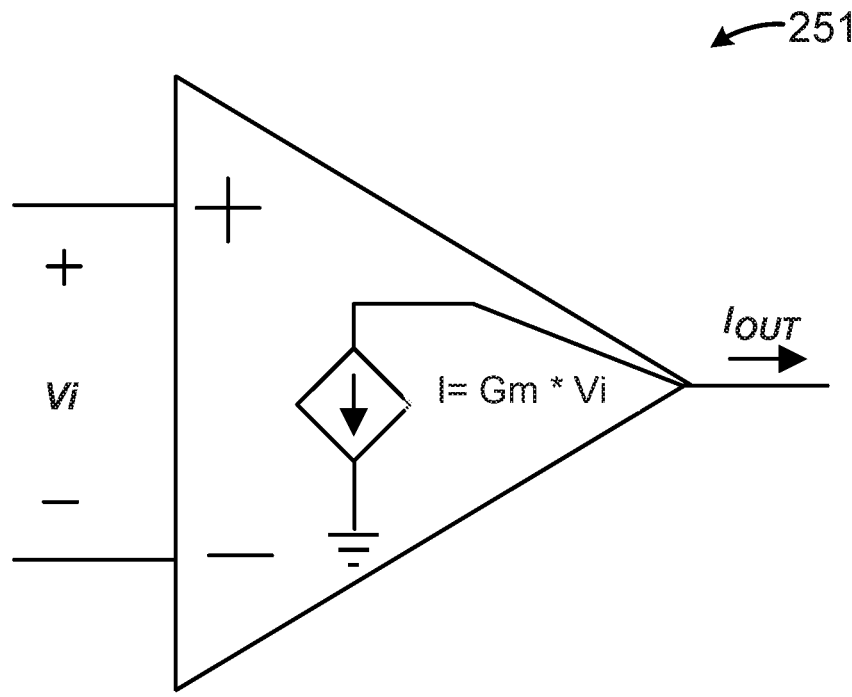
FIG. 3A depicts a simplified diagram of an exemplary transconductor.

FIG. 3A depicts a simplified diagram of an exemplary transconductor. In this depicted example, an exemplary ideal representation of the transconductor 251 is shown. The transconductor 251 receives a voltage signal Vi and then transfers the voltage signal Vi into a current output Iout. The current output Iout may be proportional to the received voltage signal Vi. For example, $I_{out}$=Gm*Vi. Gm is the transconductance (i.e. "voltage to current" gain) of the transconductor 251. The transconductor 251 may be followed by a capacitive load to form one type of integrating buffer. The capacitive load may include, for example, capacitors in regular or resettable track-and-hold circuits. The capacitive load may also include, for example, resettable capacitors. The capacitive load may also include a capacitor digital-to-analog convertor (CDAC). An architecture of an exemplary resettable capacitor is discussed in further detail with reference to FIG. 4A.

Figure 3B:
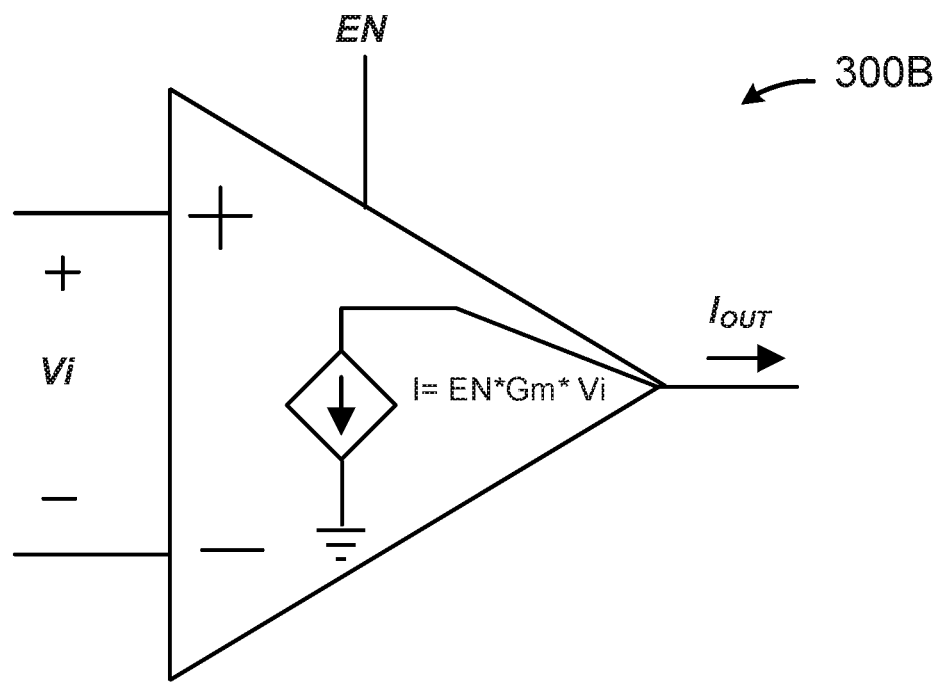
FIG. 3B depicts a simplified diagram of an exemplary gated transconductor.

FIG. 3B depicts a simplified diagram of an exemplary gated transconductor. Another exemplary transconductor that may replace the transconductor 251 or the transconductor 252 used in the sampling front-end circuit described with reference to FIG. 2A is discussed. The transconductor 300B is a gated transconductor. The gated transconductor 300B is controlled by a control signal EN. The current Iout generated by the gated transconductor 300B may be enabled or disabled according to the control signal EN being asserted or de-asserted. The gated transconductor 300B may be followed by a capacitive load (e.g., capacitors in track-and-hold circuits and/or capacitors in resettable capacitors) to form another type of integrating buffer (e.g., the integrating buffer used in the sampling front-end circuit described with reference to FIG. 2A).

Figure 3C:
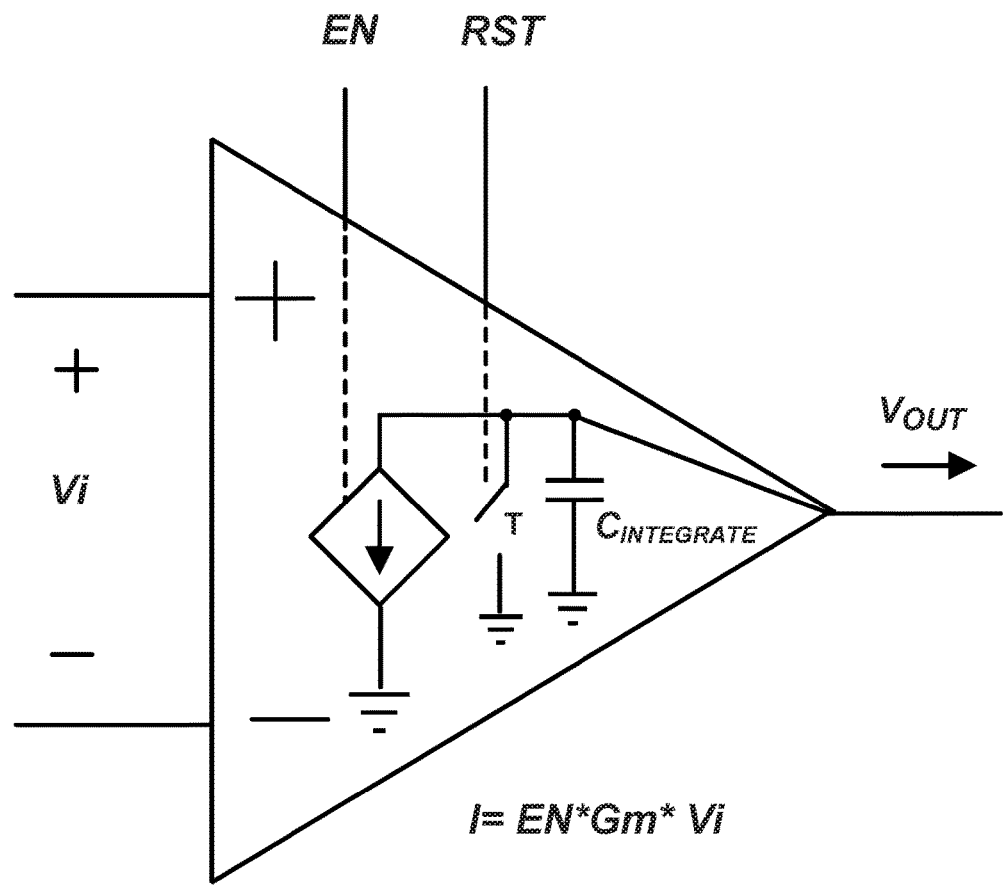
FIG. 3C depicts an exemplary integrating buffer having a gated transconductor and a resettable capacitor.

FIG. 3C depicts an exemplary integrating buffer having a gated transconductor and a resettable capacitor. In this depicted example, an integrating buffer 300C is obtained by adding a resettable capacitor to the gated transconductor 300B described with reference to FIG. 3B. The resettable capacitor includes a capacitor $C_{INTEGRATE}$ coupled to the output of the gated transconductor 300B. The resettable capacitor also includes a switch T that may be controlled by a reset signal RST. The capacitor $C_{INTEGRATE}$ may be explicit or made from circuit and/or wiring parasitic capacitance. The term resettable capacitor may be taken to mean a capacitor with accompanying circuitry permitting plate potentials to be defined by typically low impedance voltage sources, such that the voltage across the capacitor takes on a value largely determined by such voltage sources. The gated current Iout may be integrated onto a capacitor that is resettable to a finite impedance voltage source (e.g., 0 volts) by using the reset signal RST.

Figure 4A:
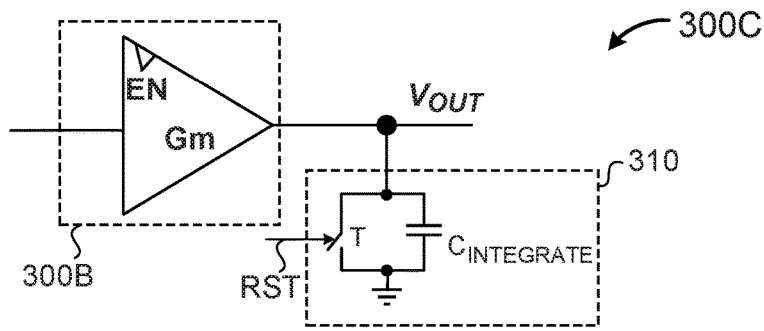
FIG. 4A depicts an exemplary symbol of the integrating buffer described with reference to FIG. 3C.

FIG. 4A depicts an exemplary symbol of the integrating buffer described with reference to FIG. 3C. In this depicted example, a symbol of the integrating buffer 300C described with reference to FIG. 3C is disclosed. The integrating buffer 300C includes a gated transconductor 300B and a resettable capacitor 310 coupled to the output of the gated transconductor 300B. The resettable capacitor 310 includes a capacitor $C_{INTEGRATE}$ coupled to the output of the gated transconductor 300B. The capacitor $C_{INTEGRATE}$ may be explicit or made from circuit and/or wiring parasitic capacitance within the structure, or an external capacitance connected to the same node. The resettable capacitor 310 also includes a switch T. The switch T, controlled by the reset signal RST, is arranged in parallel with the capacitor $C_{INTEGRATE}$. In this depicted example, the capacitor $C_{INTEGRATE}$ and the switch T are also coupled to ground. In some embodiments, the switch may be coupled to a different low impedance voltage other than ground, and the switch may be then not connected with the capacitor $C_{INTEGRATE}$ in parallel.

Figure 4B:
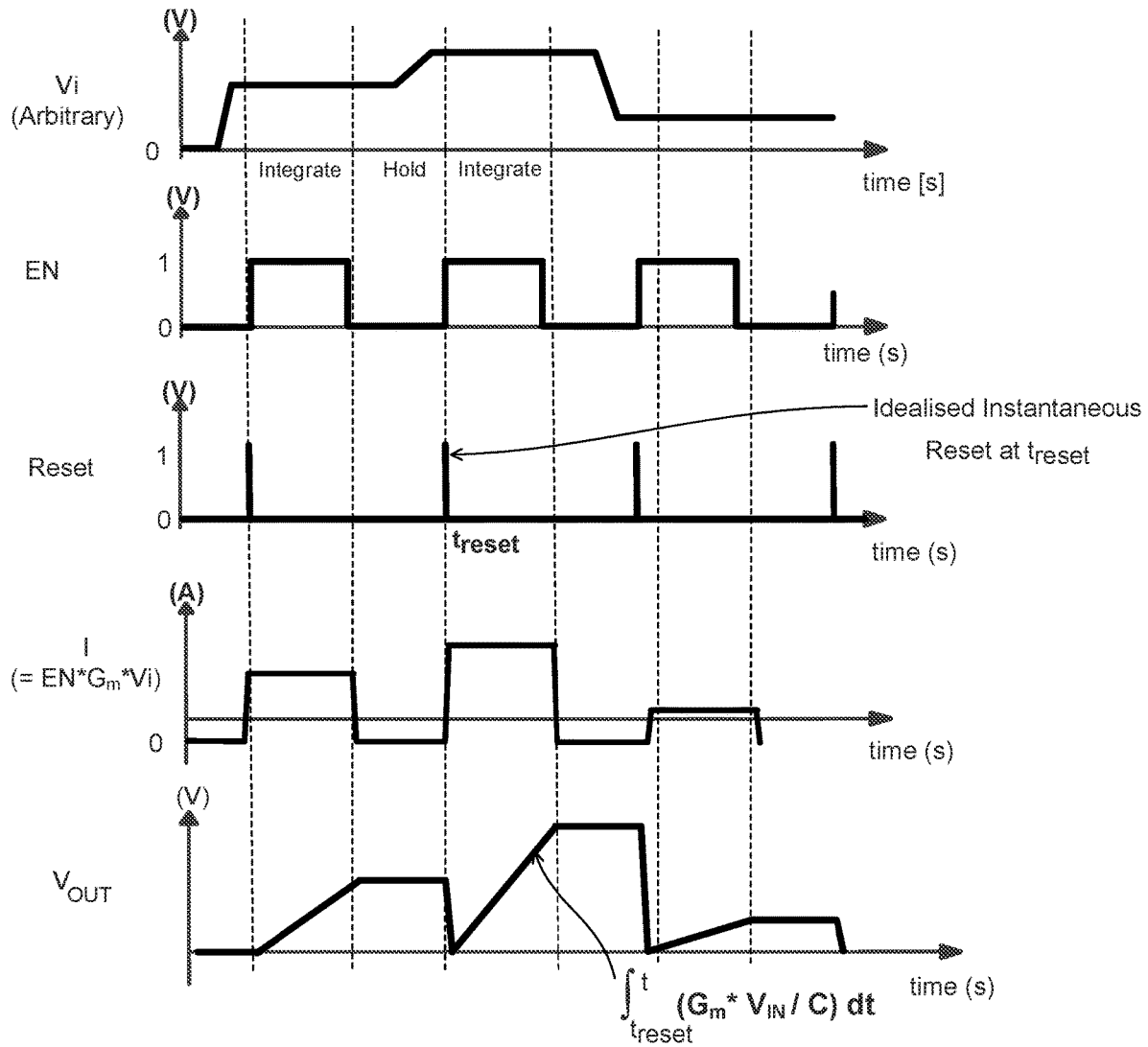
FIG. 4B depicts exemplary simplified timing diagrams for the integrating buffer described with reference to FIG. 3C.

FIG. 4B depicts exemplary simplified timing diagrams for the integrating buffer described with reference to FIG. 3C. In this depicted example, exemplary diagrams and waveforms are shown to describe an idealized example of the integrating buffer 300C described with reference to FIG. 3C. In this depicted example, waveforms of the enable signal EN, voltage Vi, current I, and voltage $V_{OUT}$ are arbitrary and are only shown to explain the fundamental operation of the integrating buffer 300C. When the enable signal EN is high (e.g., equal to logic 1), the gated voltage controlled current source may be enabled and may produce a current I proportional to the signal Vi in the load (integration) capacitor (e.g., capacitor $C_{INTEGRATE}$) to produce an output voltage $V_{OUT}$. As long as the enable signal EN is high, the integration may continue, after which the final integrated value may be held by setting EN to low. The integration may be described by the integral equation $I_{out}$=EN*Gm * Vi. When an ideal (instantaneous) reset signal RST is asserted, output voltage $V_{OUT}$ may be reset to zero or other defined constant low impedance voltage. Then the cycle may start again, the new input voltage may be integrated. By using the integrating buffer, linearly settling voltage step response may be obtained, and high-speed implementations with less power consumption of the ADC system 225 may be obtained.

Figure 5:
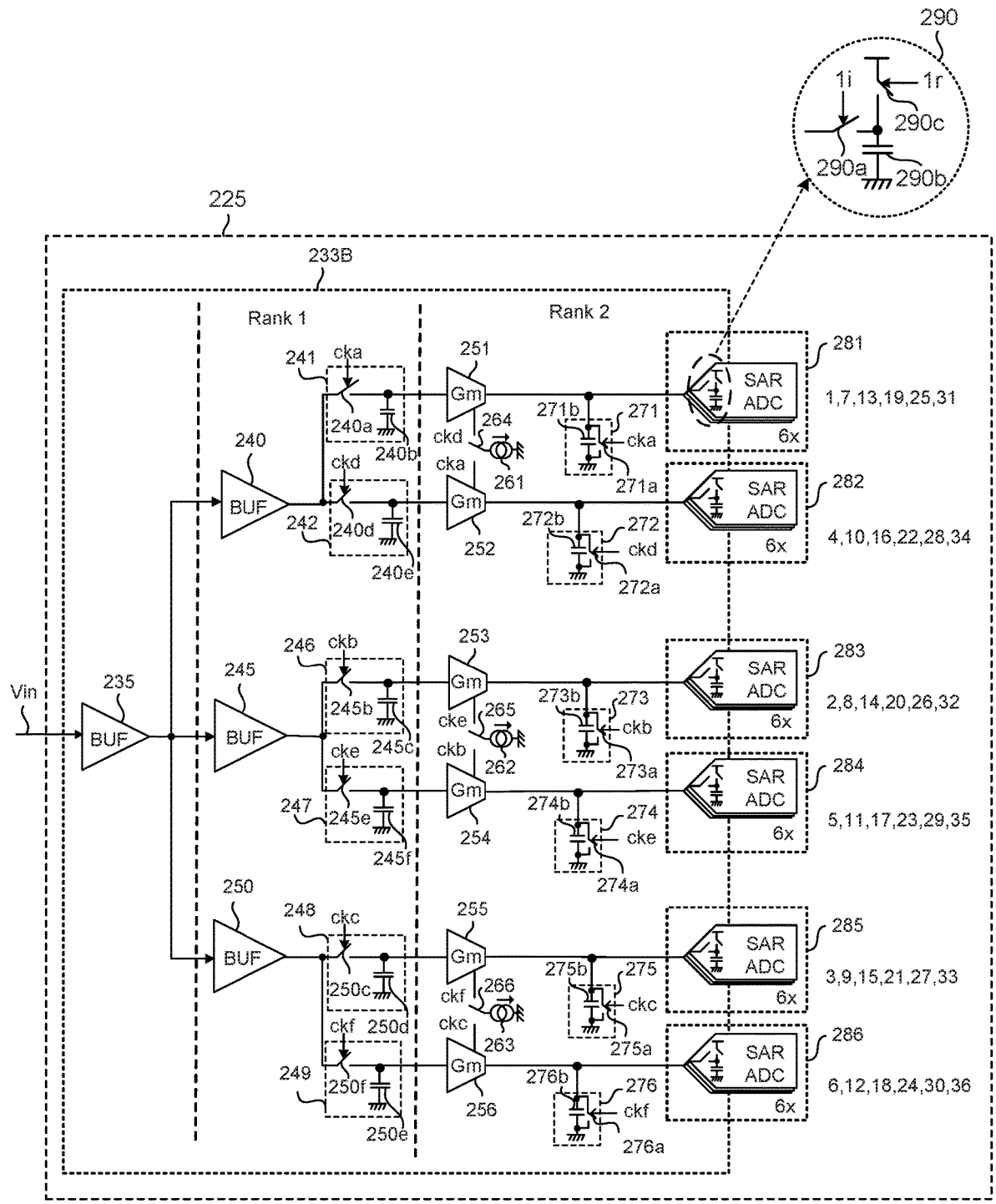
FIG. 5 depicts another exemplary sampling front-end circuit using integrating buffers.

FIG. 5 depicts another exemplary sampling front-end circuit using integrating buffers. In this depicted example, a second exemplary sampling front-end circuit 233B is discussed. The sampling front-end circuit 233B includes a voltage buffer 235 and a two-layer sampling structure. The voltage buffer 235 is optional and may be used to receive the filtered analog signal Vin. A first sampling layer of circuits Rank 1 of the sampling front-end circuit 233B includes, for example, three voltage buffers 240, 245, and 250. Each of the three voltage buffers 240, 245, and 250 is coupled to the output of the voltage buffer 235. The first sampling layer of circuits Rank 1 also includes, for example, six switches 240a, 240d, 245b, 245e, 250c and 250d, and six capacitors 240b, 240e, 245c, 245f, 250d and 250e. The switch 240a and the switch 240d are coupled to the output of the voltage buffer 240. The switch 245b and the switch 245e are coupled to the output of the voltage buffer 245. The switch 250c and the switch 250d are coupled to the output of the voltage buffer 250. Each of the six switches 240a, 240d, 245b, 245e, 250c and 250d is controlled by a corresponding clock signal cka, ckd, ckb, cke, ckc, and ckf, respectively. Each capacitor of the six capacitors 240b, 240e, 245c, 245f, 250d and 250e is connected to a corresponding switch of the six switches 240a, 240d, 245b, 245e, 250c and 250d in series to form a corresponding track-and-hold circuit 241, 242, 246, 247, 248 and 249.

A second sampling layer of circuits Rank 2 of the sampling front-end circuit 233B includes, for example, six transconductors 251, 252, 253, 254, 255, and 256. Each of the six transconductors 251, 252, 253, 254, 255, and 256 is coupled to the output of a corresponding switch of the six switches 240a, 240d, 245b, 245e, 250c and 250d, respectively. The second sampling layer of circuits Rank 2 also includes, for example, three current sources 261, 262, and 263, and a first group of switches 264, 265, and 266. Each current source is arranged between two adjacent buffers. For example, the current source 261 is arranged between the transconductors 251 and 252. The current source 262 is arranged between the transconductors 253 and 254. The current source 263 is arranged between the transconductors 255 and 256. One terminal of each of the current sources 261, 262, and 263 is coupled to a reference voltage (e.g., ground), and the other terminal of each of the current sources 261, 262, and 263 is coupled to a switch of the first group of switches 264, 265, and 266. For example, the other terminal of the current source 261 is coupled to switch 264. The current source 261 may be connected to the transconductor 251 under the control of the ckd, and the current source 261 may also be connected to the transconductor 252 under the control of the cka through the switch 264. Similarly, the current source 262 and current source 263 may also be connected to two adjacent transconductors (e.g., transconductors 253 and 254, transconductors 255 and 256) through a corresponding switch (e.g., switch 265, or switch 266).

The second sampling layer of circuits Rank 2 also includes a second group of switches 271a, 272a, 273a, 274a, 275a, and 276a, and a second group of capacitors 271b, 272b, 273b, 274b, 275b, and 276b. Each capacitor of the second group of capacitors 271b, 272b, 273b, 274b, 275b, and 276b is connected to a corresponding switch of the second group of switches 271a, 272a, 273a, 274a, 275a, and 276a in parallel to form a corresponding resettable capacitor 271, 272, 273, 274, 275, and 276 to reset the transconductors 251-256. A corresponding transconductor followed by a corresponding resettable capacitor forms one type of integrating buffers. Each switch of the second group of switches is coupled to the output of a corresponding transconductor 251-256, and each switch of the second group of switches is controlled by a corresponding clock signal cka, ckb, ckc, ckd, cke, and ckf. In some embodiments, switches in the same sampling path may be controlled by different clock signals. For example, the switch 271a and the switch 240a may be controlled by different clock signals. The other terminal of each switch of the second group of switches is coupled to a supply voltage.

In this depicted example, the ADC system 225 also includes 36 time-interleaved sub-ADCs connected to the sampling front-end circuit 233B. Every six sub-ADCs are controlled by a corresponding sampling and hold path. Each transconductor of the six transconductors 251-256 is also followed by six sub-ADCs of the 36 sub-ADCs. For example, six sub-ADCs in a subsystem 281 is connected to the output of the transconductor 251. Each sub-ADC also includes a resettable track-and-hold circuit. For example, a first sub-ADC includes a resettable track-and-hold circuit 290. The resettable track-and-hold circuit 290 includes a first integration switch 290a. One terminal of the first integration switch 290a is coupled to the transconductor 251, the other terminal of the first integration switch 290a is coupled to one terminal of a capacitor 290b. The other terminal of the capacitor 290b is coupled to, for example, ground. The resettable track-and-hold circuit 290 also includes a first reset switch 290c. One terminal of the first reset switch 290c is coupled to the other terminal of the first integration switch 290a, and the other terminal of the first reset switch 290c is coupled to a power supply (e.g., a finite impedance voltage source), for example. The resettable track-and-hold circuit 290 following the transconductor may be controlled by a first integration signal $1i$ and a first reset signal $1r$. The first integration switch 290a may be controlled by the first integration signal $1i$ and the first reset switch 290c may be controlled by the first reset signal $1r$. Timing diagrams of the six clock signals and exemplary integration signals and reset signals are described in detail with reference to FIG. 6.

The filtered analog signal Vin is received by the transconductors in the two-layer structure and is then sampled by the 36 time-interleaved sub-ADCs. Each subsystem path through the various layers of the subsystems 281-286 is driven by a different clock signal. Two adjacent subsystems of the subsystems 281-286 are driven by two anti-phase clock signals. For example, a first clock signal cka used by the first subsystem 281 may have a 0-degree phase difference compared to a reference clock signal. The clock signal ckd used by the subsystem 282 may have a 180-degree phase difference compared to the reference clock signal. As the clock signal cka and ckd are anti-phased, interferences between two samples may be advantageously reduced.

The sampling sequence may be adjusted to make two subsystems connected to the same buffer in the first sampling layer of circuits controlled by anti-phase clock signals. For example, for the 36 time-interleaved sub-ADCs, a $1^{st}$ sample, a $7^{th}$ sample, a $13^{th}$ sample, a $19^{th}$ sample, a $25^{th}$ sample, and a $31^{st}$ sample may be sampled by sub-ADCs in the subsystem 281. A $4^{th}$ sample, a $10^{th}$ sample, a $16^{th}$ sample, a $22^{nd}$ sample, a $28^{th}$ sample, and a $34^{th}$ sample may be sampled by sub-ADCs in the subsystem 282.

In this depicted example, six clock signals (e.g., cka, ckb, ckc, ckd, cke, ckf) are used to control the six subsystems 281-286. A phase difference between two consecutive sampling clock signals may be 60-degree (e.g., 360/6, 6 is the number of clock signals). For example, the first clock signal cka used by the first subsystem 281 may have a 0-degree phase difference compared to a reference clock signal. The clock signal ckb used by the subsystem 283 may have a 60-degree phase difference compared to the reference clock signal. The third sampling clock signal ckc used by the subsystem 285 may have a 120-degree phase difference compared to the reference clock signal. In some embodiments, other phase relationships may be used based on different number of sampling paths and/or clock signals. For example, a sampling front-end circuit may include M sampling paths, and M clock signals may be used to control the sampling. A phase difference between two consecutive clock signals may be 360/M.

Although in this depicted example, the second sampling layer of circuits Rank 2 includes integrating buffers (e.g., transconductor shown in FIG. 3A followed by a resettable capacitor), in some embodiments, one or more of the transconductors 251-256 may be the gated transconductor shown in FIG. 3B. In some embodiments, one or more of the voltage buffers the first sampling layer of circuits Rank 1 may also be replaced by integrating buffers. The integrating buffers used in the first sampling layer of circuits Rank 1 may be same or different than the integrating buffers used in the first sampling layer of circuits Rank 2. For example, the resettable capacitors 271-276 may be replaced by (resettable or regular) track-and-hold circuits. By using the transconductor as part of an integrating buffer, a faster settling response may be obtained (a "linear" settling characteristic, as opposed to an "exponential" settling characteristic), and required bandwidth may be relaxed by more than 5 times and the power may be reduced to less than 30% while keeping the same footprint.

Figure 6:
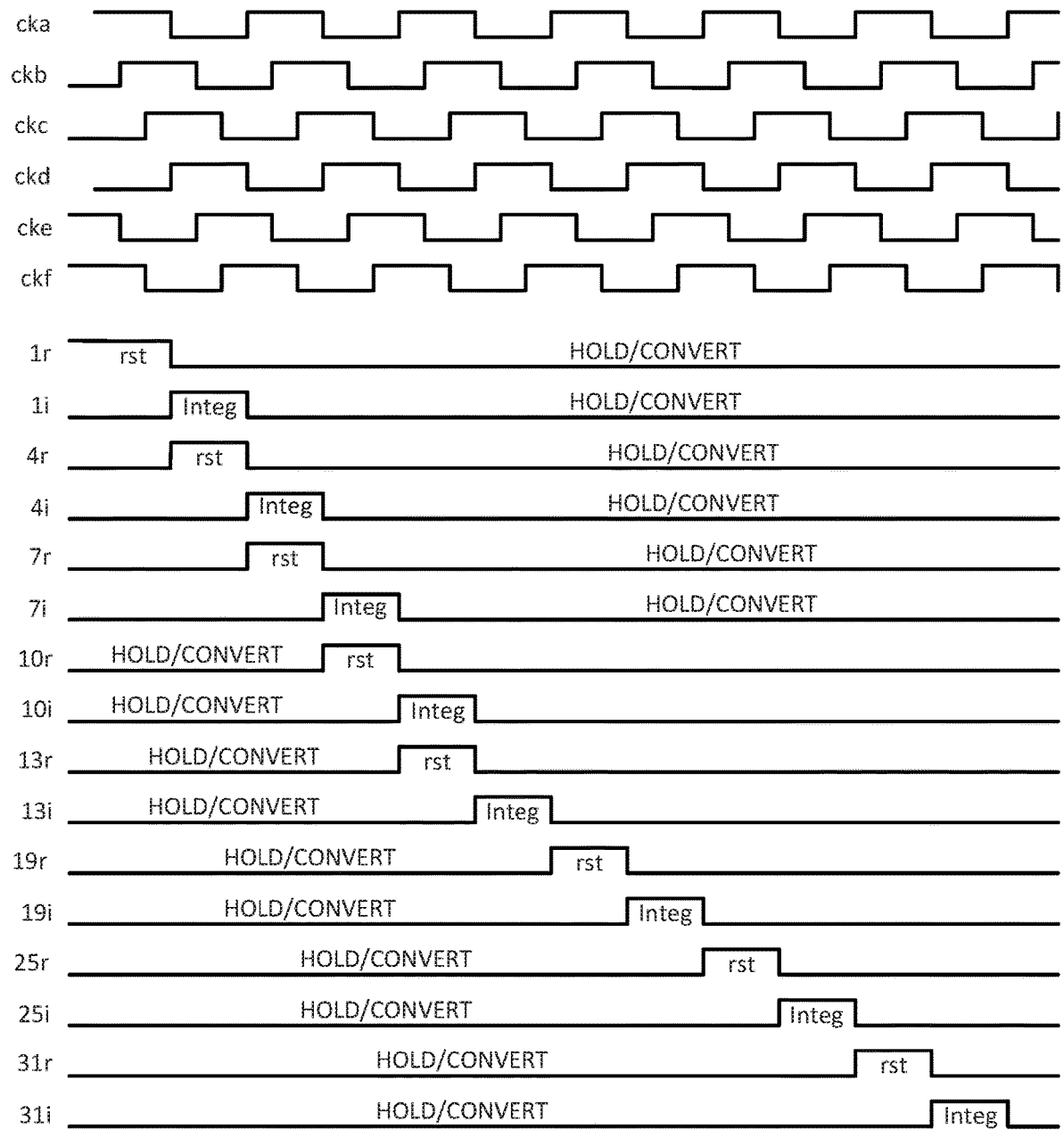
FIG. 6 depicts timing diagrams of exemplary clock signals of the sampling front-end circuit described with reference to FIG. 5.

FIG. 6 depicts timing diagrams of exemplary clock signals of the integrating sampling front-end circuit described with reference to FIG. 5. In this depicted example, the timing diagrams of clock signals cka, ckb, ckc, ckd, cke, and ckf are shown. Two consecutive clock signals have a 60-degree phase difference. And the clock signals for two subsystems that connected to a same buffer in the previous layer are anti-phased. For example, the clock signal cka is used in the path for subsystem 281, and the clock signal ckd is used in the path for subsystem 282. The subsystem 281 and the subsystem 282 are connected to the same voltage buffer 240 in the first sampling layer of circuits Rank 1. The clock signals cka and ckd are in anti-phase. Thus, interferences between two samples may be advantageously reduced.

Timing diagrams of exemplary integration signals and reset signals are also shown. For example, the first reset signal 1r used to reset the resettable track-and-hold circuit (e.g., the resettable track-and-hold circuit 290) in a first SAR ADC of the subsystem 281 is changed from low to high at the rising edge of the clock signal cka, and the resettable track-and-hold circuit is in reset mode. Then the first integration signal 1i used to hold the resettable track-and-hold circuit (e.g., the resettable track-and-hold circuit 290) in the first SAR ADC of the subsystem 281 is changed from low to high at the falling edge of the clock signal cka. And at the falling edge of the first integration signal 1i, the first SAR ADC of the subsystem 281 may start performing data conversion. Timing diagrams of reset signals and integration signals used for the 4$^{th}$ sample, 7$^{th}$ sample, 10$^{th}$ sample, 13$^{th}$ sample, 19$^{th}$ sample, 25$^{th}$ sample and 31$^{st}$ sample performed in the first subsystem 281 and the second subsystem 282 are also shown in FIG. 6. The equivalent sampling window duration of each sub-ADC may be the sum of reset time and integration time.

Figure 7:
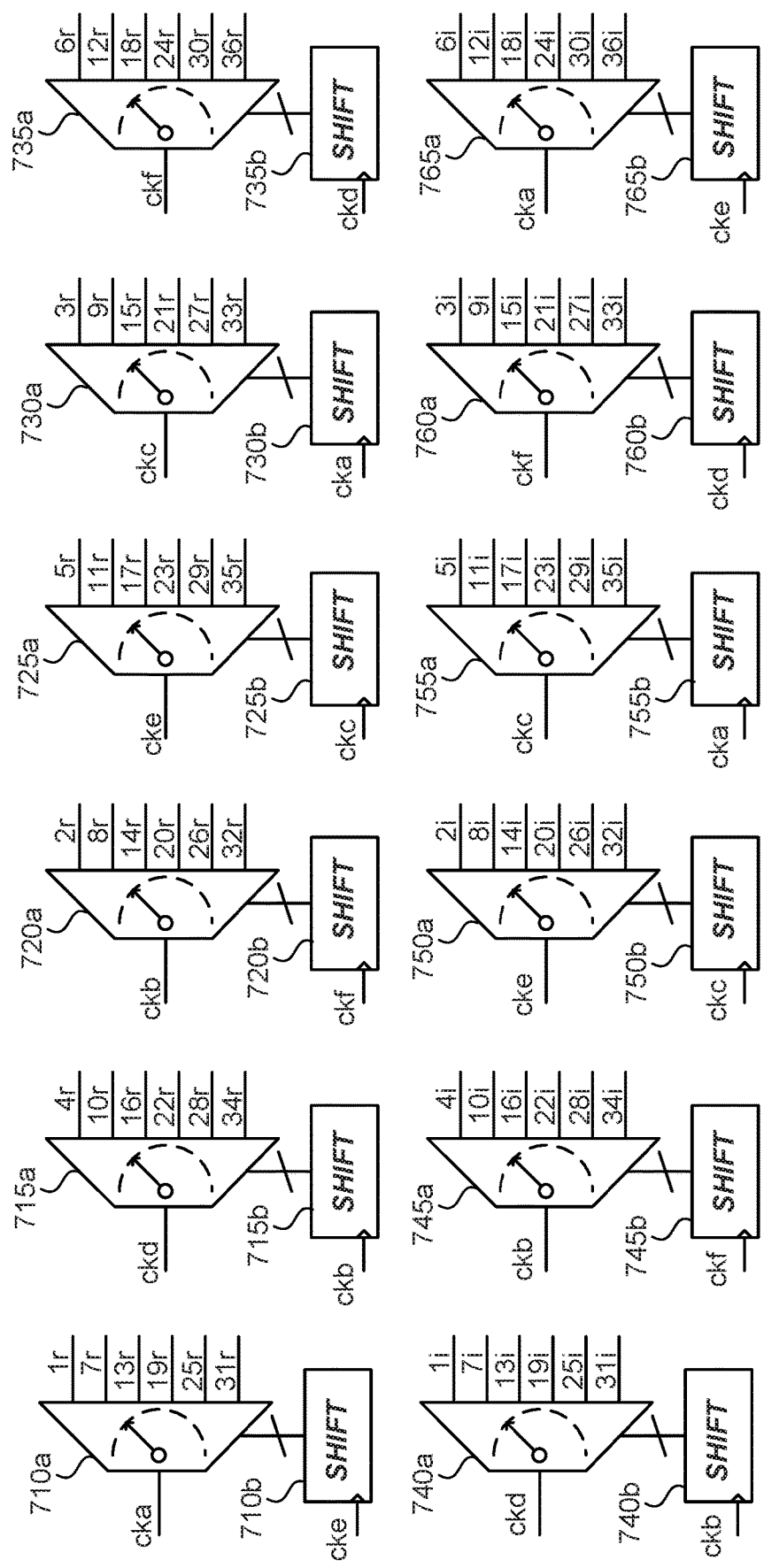
FIG. 7 depicts an exemplary clock local distribution scheme for sub-ADCs in the TI-ADC converter with reference to FIG. 5.

FIG. 7 depicts an exemplary clock local distribution scheme for sub-ADCs in the TI-ADC converter with reference to FIG. 5. As discussed with reference to FIG. 5, the ADC system 225, in the depicted example, includes six subsystems (e.g., 281-286) in six different sampling paths. Each subsystem includes 6 sub-ADCs. To control the resettable track-and-hold circuit (e.g., the resettable track-and-hold circuit 290), an integration signal (e.g., 1i) and a reset signal (e.g., 1r) may be generated. Clock signals, used to control the individual sub-ADCs, sharing the same Rank 2 buffer, may be obtained from one of the clocks controlling track-and-hold circuits in the first sampling layer of circuits Rank 1. For example, a demultiplexer (demux) may be used to distribute the pluses form the Rank 1 clock through the correspondent sub-ADCs.

In this depicted example, a demultiplexer (demux) may be used to generate six reset signals or six integration signals. For example, a first demux 710a may be used to receive the clock signal cka to generate six reset clock signals 1r, 7r, 13r, 19r, 25r, and 31r for six reset switches in the six sub-ADCs of the first subsystem 281, respectively. A first shift register 710b may be used to receive, for example, the clock signal cke and generate a selection signal for the first demux 710a. The first demux 710a may output a corresponding reset signal to control the reset switch (e.g., reset switch 290c) in response to the selection signal generated by the first shift register 710b. As shown in FIG. 3, the rising edges of reset signals (e.g., 7r, 13r, 19r, 25r, and 31r) and integration signals (7i, 13i, 19i, 25i, and 31i) for the first subsystem 281 happens shortly after the rising edge of the clock signal cke. In some embodiments, other clock signals may also be used to generate the selection signal.

A second demux 715a and a second shift register 715b may be used to generate six reset clock signals 4r, 10r, 16r, 22r, 28r, and 34r for six reset switches in the six sub-ADCs of the second subsystem 282 in response to the clock signal ckd and clock signal ckb. Similarly, demux 720a, 725a, 730a and 735a, and corresponding shift registers 720b, 725b, 730b and 735b may be used to generate corresponding reset signals for corresponding sub-ADCs in the third, fourth, fifth, and sixth subsystems 283-286, respectively.

In this depicted example, a seventh demux 740a is used to receive the clock signal ckd to generate six integration clock signals 1i, 7i, 13i, 19i, 25i, and 31i for six integration switches in the six sub-ADCs of the first subsystem 281, respectively. A seventh shift register 740b may be used to receive, for example, the clock signal ckb and generate a selection signal for the seventh demux 740a. In some embodiments, the seventh shift register 740b may also be used to receive another clock signal (e.g., clock signals rather than the input signal received by the demux 740a) and generate a selection signal for the seventh demux 740a to reduce glitches happen in between transitions. The seventh demux 740a may output a corresponding integration signal to control an integration switch (e.g., the integration switch 290a) in response to the selection signal generated by the seventh shift register 740b. Similarly, demux 745a, 750a, 755a, 760a and 765a, and corresponding shift registers 545b, 550b, 755b, 760b and 765b may be used to generate corresponding integration signals for corresponding sub-ADCs in the second third, fourth, fifth, and sixth subsystems 282-286, respectively. Thus, sampling may be performed by continuously rotation.

Figure 8:
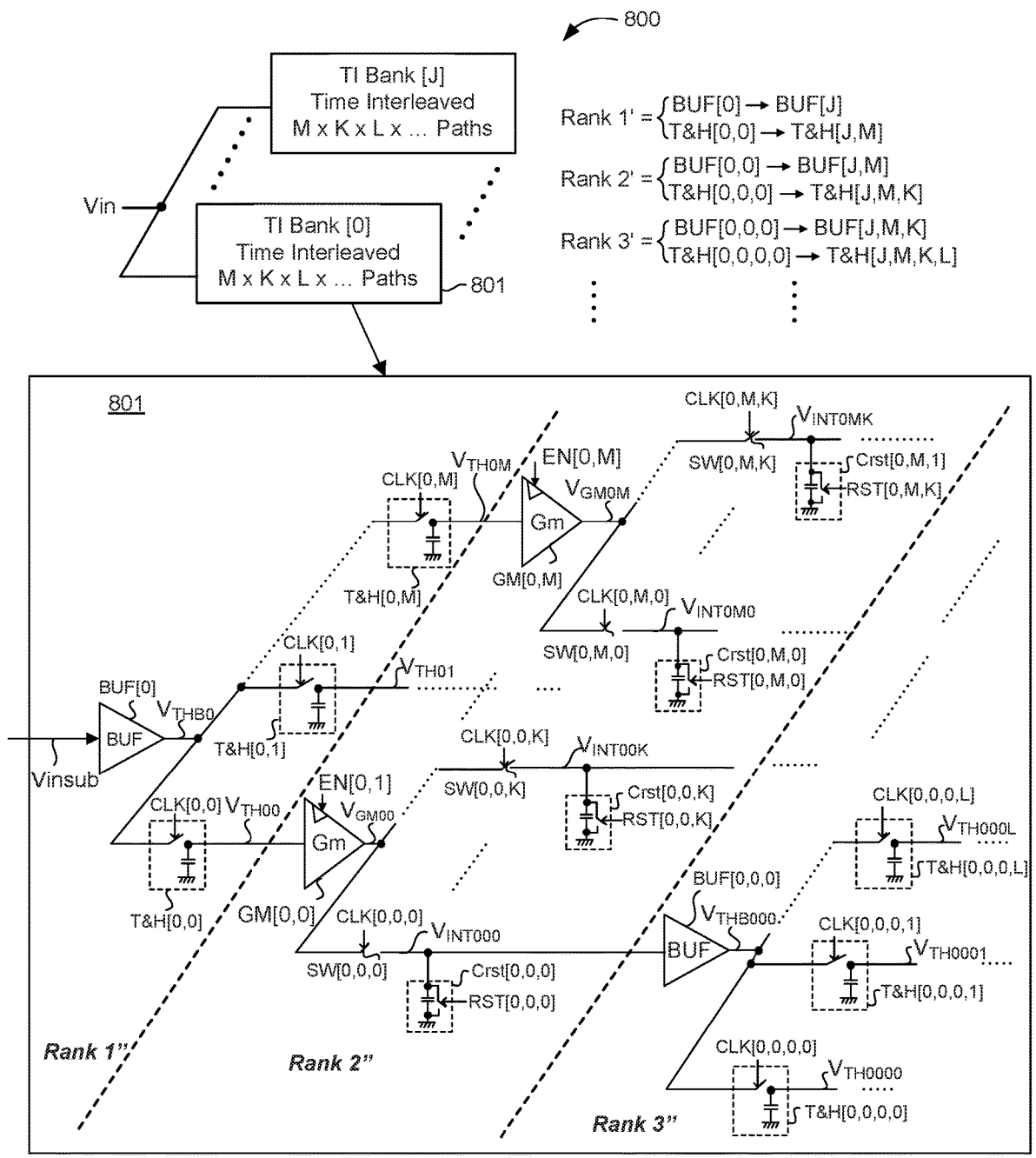
FIG. 8 depicts another exemplary generalized integrating sampling front-end circuit implemented with the integrating buffers described with reference to FIG. 3C.

FIG. 8 depicts another exemplary generalized sampling front-end circuit implemented with the integrating buffer described with reference to FIG. 3C. In this depicted example, an exemplary generalized sampling front-end circuit 800 is discussed. The sampling front-end circuit 800 includes J+1 different time-interleaved (TI) banks configured to receive an input signal (e.g., the filtered analog signal Vin). J may be any positive integer or 0. The sampling front-end circuit 800 includes a number of sampling layer of circuits (i.e., ranks). For example, a first sampling layer of circuits Rank1', a second sampling layer of circuits Rank 2', a third sampling layer of circuits Rank 3', etc. Each TI bank may include a number of buffers, switches and capacitors to form a sub sampling front-end circuit. Each sub sampling front-end circuit may be a multi-layer (multi-rank) sampling structure.

For example, a first sub sampling front-end circuit 801 comprising a first TI bank (e.g., TI bank[0]) depicts a structure with at least three layers. The first sampling layer of circuits Rank 1" of the first sub sampling front-end circuit 801 includes a voltage buffer BUF[0]. The voltage buffer BUF[0] is used to receive a sub-input signal Vinsub and generate a signal $V_{THB0}$. The first sampling layer Rank 1" also includes M+1 regular track-and-hold circuits T&H[0,0], T&H[0,1], . . . , T&H[0,M]. M may be any positive integer or 0. All the M+1 regular track-and-hold circuits T&H[0,0], T&H[0,1], . . . , T&H[0,M] are commonly coupled to the output of the voltage buffer BUF[0] in the first layer Rank 1". Each switch in each of the M+1 regular track-and-hold circuits is controlled by a corresponding clock signal CLK [0,0], CLK[0,1], . . . , CLK[0,M]. Each of the M+1 regular track-and-hold circuits may generate a corresponding track-and-hold signal $V_{TH00}$, $V_{TH01}$, . . . $V_{TH0M}$ in response to the corresponding clock signal CLK[0,0], CLK[0,1], . . . , CLK[0,M] and the sub input signal Vinsub. In some embodiments, the sub input signal Vinsub may be a differential signal. And all or part of the first sub sampling front-end circuit 801 may be differential to receive and sample the differential signal Vinsub. For example, the transconductor may be a differential transconductor. The track-and-hold circuits T&H[0,0], T&H[0,1], . . . , T&H[0,M] may also be differential. In some embodiments, all or part of the sampling front-end circuit 233A may be single-ended to receive and sample the signal Vin.

A second sampling layer of circuits Rank 2" of the sub sampling front-end circuit 801 includes, for example, M+1 gated transconductors (e.g., the gated transconductor 600B). Each of the M+1 gated transconductors Gm[0,0], . . . , Gm[0,M] is coupled to a corresponding regular track-and-hold circuit of the M+1 regular track-and-hold circuits in the first sampling layer of circuits Rank 1'. Each gated transconductor of the M+1 gated transconductors in the second sampling layer of circuits Rank 2" may generate a corresponding signal $V_{GM00}$, . . . , $V_{GM0M}$ due to the current output of the particular Gm being integrated into to the capacitance at the corresponding Gm output added to the capacitance in the corresponding active track-and-hold (i.e. the capacitance on one of the nets $V_{TH00}$, $V_{TH01}$, . . . $V_{TH0M}$).

The second sampling layer of circuits Rank 2" also includes, for example, (M+1)*(K+1) switches SW[0,0,0], . . . , SW[0,0,K], . . . , SW[0,M,K]. K may be any positive integer or 0. When K=0, the sub sampling front-end circuit 801 may have a similar structure to the sampling front-end circuit 233B described with reference to FIG. 5. Every K+1 switches of the (M+1)*(K+1) switches are commonly connected to an output of a corresponding gated transconductor in the second sampling layer of circuits Rank 2". For example, the K+1 switches SW[0,M,0], . . . , SW[0,M,1], . . . , SW[0,M,K] are all coupled to the output of the gated transconductor Gm[0,M].

The second sampling layer of circuits Rank 2" also includes (M+1)*(K+1) resettable capacitors $C_{rst}$[0,0,0], . . . , $C_{rst}$[0,0,K], . . . , $C_{rst}$[0,M,K]. Each of the (M+1)*(K+1) resettable capacitor (e.g., the resettable capacitor 710) is coupled to a corresponding switch of the (M+1)*(K+1) switches. Each switch in each of the resettable capacitors $C_{rst}$[0,0,0], . . . , $C_{rst}$[0,0,K], . . . , $C_{rst}$[0,M,K] is controlled by a corresponding reset signal RST[0,0,0], . . . , RST[0,0,K], . . . , RST[0,M,K]. The gated transconductors Gm[0,0], . . . , Gm[0,M] and the resettable capacitors in the second sampling layer of circuits Rank 2" form integrating buffers (e.g., the integrating buffer 300C in FIG. 3C). Each of the formed integrating buffers may generate a corresponding integrated signal $V_{INT000}$, . . . , $V_{INT0MK}$. In some embodiments, the second sampling layer of circuits Rank 2" may also include another group of capacitors that may connected with a corresponding switches in the K+1 switches SW[0,M,0], . . . , SW[0,M,1], . . . , SW[0,M,K] to form a number of track-and-hold circuits (not shown).

A third sampling layer of circuits Rank 3" of the sub sampling front-end circuit 801 includes, (M+1)*(K+1) voltage buffers BUF[0,0,0], . . . , BUF[0,0,K], . . . , BUF[0,M,K]. Each of the (M+1)*(K+1) voltage buffers is coupled to the output of a corresponding resettable capacitor $C_{rst}$[0,0,0], . . . , $C_{rst}$[0,0,K], . . . , $C_{rst}$[0,M,K] to receive a corresponding integrated signal $V_{INT000}$, . . . , $V_{INT0MK}$.

The third sampling layer of circuits Rank 3" may also include (M+1)*(K+1)*(L+1) track-and-hold circuits. L may be any positive integer or 0. Every L+1 track-and-hold circuits of the (M+1)*(K+1)*(L+1) track-and-hold circuits are commonly connected to an output of a corresponding voltage buffer in the third sampling layer of circuits Rank 3". For example, the L+1 regular track-and-hold circuits T&H [0,0,0,0], T&H[0,0,0,1], . . . , T&H[0,0,0,L] are all coupled to the output of the voltage buffer BUF[0,0,0]. Each switch in each of the (M+1)*(K+1)*(L+1) track-and-hold circuits may be controlled by a corresponding clock signal. For example, the switch in the track-and-hold circuit T&H[0,0,0,0] is controlled by a clock signal CLK[0,0,0,0].

Each Sub-ADC may be coupled to each of the (M+1)* (K+1)*(L+1) regular track-and-hold circuits in the third sampling layer of circuits Rank 3". In some embodiments, each of the (M+1)*(K+1)*(L+1) track-and-hold circuits may be implemented in a corresponding sub-ADC. In some embodiments, the sub sampling front-end circuit 801 may also include an N-layer sampling structure. N 3. For example, the sub sampling front-end circuit 801 may be a four-layer sampling structure that further includes a fourth sampling layer of circuits Rank 4" (not shown).

In this description example, the buffers in the second sampling layer of circuits Rank 2" are integrating buffer described with reference to FIG. 3C. In some embodiments, some or all of the integrating buffers may be replaced by other types of integrating buffers. For example, the integrating buffers may include the transconductors 251. For example, the integrating buffers may include the gated transconductors 300B followed by a different capacitive load (e.g., capacitors in a track-and-hold circuit). In some embodiments, some or all of the voltage buffers (e.g., BUF[0], GM[0,0]-GM[0,M], BUF[0,0,0]-BUF[0,M,K]) in the sub sampling front-end circuit 801 may be also replaced by the same or different integrating buffers. By using integrating buffers, a faster settling response (with "linear" settling characteristic) may be obtained and required bandwidth may be relaxed and the power and potentially the input capacitance may be reduced while keeping the same footprint or potentially a smaller footprint.

Figure 9:
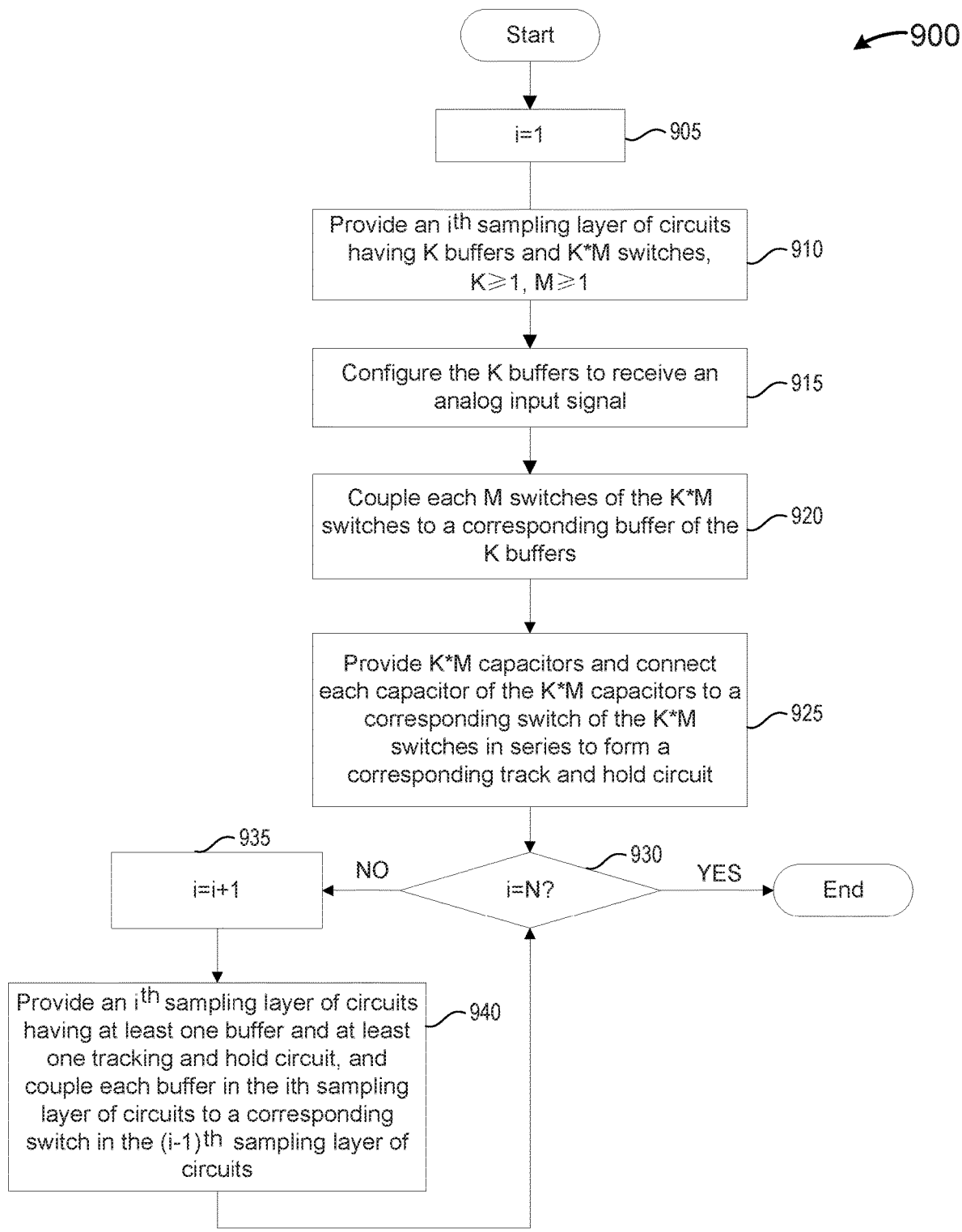
FIG. 9 depicts a flow chart of an exemplary method to implement the integrating sampling front-end circuit described with reference to FIG. 8.

FIG. 9 depicts a flow chart of an exemplary method to implement a sub sampling front-end circuit described with reference to FIG. 8. An exemplary method 900 to implement a sub sampling front-end circuit in FIG. 8 is described. The method 900 includes, at 905, introducing a variable i and initializing the variable i equal 1. The method 900 also includes, at 910, providing an $i^{th}$ sampling layer of circuits (Rank 1") having K buffers (e.g., BUF[0]) and K*M switches (switches in the track-and-hold circuits T&H[0,0], T&H[0,1], . . . , T&H[0,M]), K≥1, M≥1.

The method 900 also includes, at 915, configuring the K buffers to receive an analog input signal (Vinsub). The method 900 includes, at 920, coupling each M switches of the KIM switches to a corresponding buffer of the K buffers, M≥1, K≥1. At least one buffer of the K buffers may include an integrating buffer. By replacing voltage buffers with integrating buffer, a faster settling response with "linear" settling characteristic may be obtained, thus, high-speed implementations with less power consumption of the ADC system 225 may be obtained. In some embodiments, the integrating buffers may include transconductors, and/or gated transconductors followed by a corresponding capacitive load. In some embodiments, the capacitive load may include capacitors in track-and-hold circuits and/or resettable capacitors.

The method 900 also includes, at 925, providing KIM capacitors and connecting each capacitor of the KIM capacitors to a corresponding switch of the K*M switches in series to form a corresponding track-and-hold circuit in the $i^{th}$ sampling layer of circuits (Rank 1"). The method 900 also includes, at 930, determining whether a predetermined N-layer sampling front-end circuit is obtained. If yes, the method 900 ends. If not, then at 935, the variable i is incremented. And, the method also includes, at 940, providing an $i^{th}$ sampling layer of circuit that having at least one buffer and at least one track-and-hold circuit, and coupling each buffer in the $i^{th}$ sampling layer to a corresponding switch in the $(i-1)^{th}$ sampling layer of circuits. The buffers in the N-layer sampling front-end circuit includes one or more integrating buffers.

For example, the method 900 may include providing a second sampling layer of circuits (e.g., Rank 2') having KIM buffers and coupling each buffer of the K*M buffers to a corresponding switch of the K*M switches in the first sampling layer of circuits. The second sampling layer of circuits may include at least one track-and-hold circuits. In some embodiments, the method 900 may also include providing a third sampling layer of circuits (e.g., Rank 3") comprising K*M*L track-and-hold circuits (e.g., the track-and-hold circuits T&H[0,0,0,0], T&H[0,1], . . . , T&H[0,M,K,L] in FIG. 8) and K*M*L buffers (not shown), coupling each track-and-hold circuits of the K*M*L track-and-hold circuits to a corresponding buffer of the KIM buffers in the second sampling layer of circuits Rank 2", and coupling each buffer of the K*M*L buffers to a corresponding track-and-hold circuit of the K*M*L track-and-hold circuits in the third sampling layer of circuits Rank 3". The buffers in the second sampling layer of circuits Rank 2" and/or the third sampling layer of circuits may be voltage buffers and/or integrating buffers. In some embodiments, the method 900 may also include one or more steps to provide a N-layer sampling front-end circuit, N 3, for example. In some embodiments, the buffers in one rank of the N-layer sampling front-end circuit may include a first type of integrating buffer. Buffers in one or more other ranks of the N-layer sampling front-end circuit may include the same or different types integrating buffers from the first type of integrating buffer.

In some embodiments, the sampling front-end circuit 233A, the sampling front-end circuit 233B, or the sampling front-end circuit 800 may be arranged on the same integrated circuit (e.g., IC 215) with the sub-ADCs (e.g., sub-ADCs 281-286). In another embodiment, the sampling front-end circuit may be implemented in a different integrated circuit (e.g., another FPGA) to perform the tracking and holding. In some embodiments, the sampling front-end circuit may be implemented as hard block fixed circuitry. For example, an application specific integrated circuit (ASIC) may provide a sampling front-end circuit with customized hardware circuitry. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

In some embodiments, some or all of the functions of the sampling front-end circuit may be implemented in a processor that is configured to execute a set of instructions stored in a data store to control the sampling. The processor may be arranged on the same integrated circuit with the filter 220 and the DSP 230. For example, the sampling front-end circuit, the filter, and the data store may be implemented in a programmable logic block of a system-on-chip (SOC), and the processor and the DSP 230 may be implemented in another hard block using, for example, fixed circuitry of the SOC, or another SOC on a separate chip. In some embodiments, software programs may be used to control the generation of clock signals used in the sampling front-end circuit.

Figure 10:
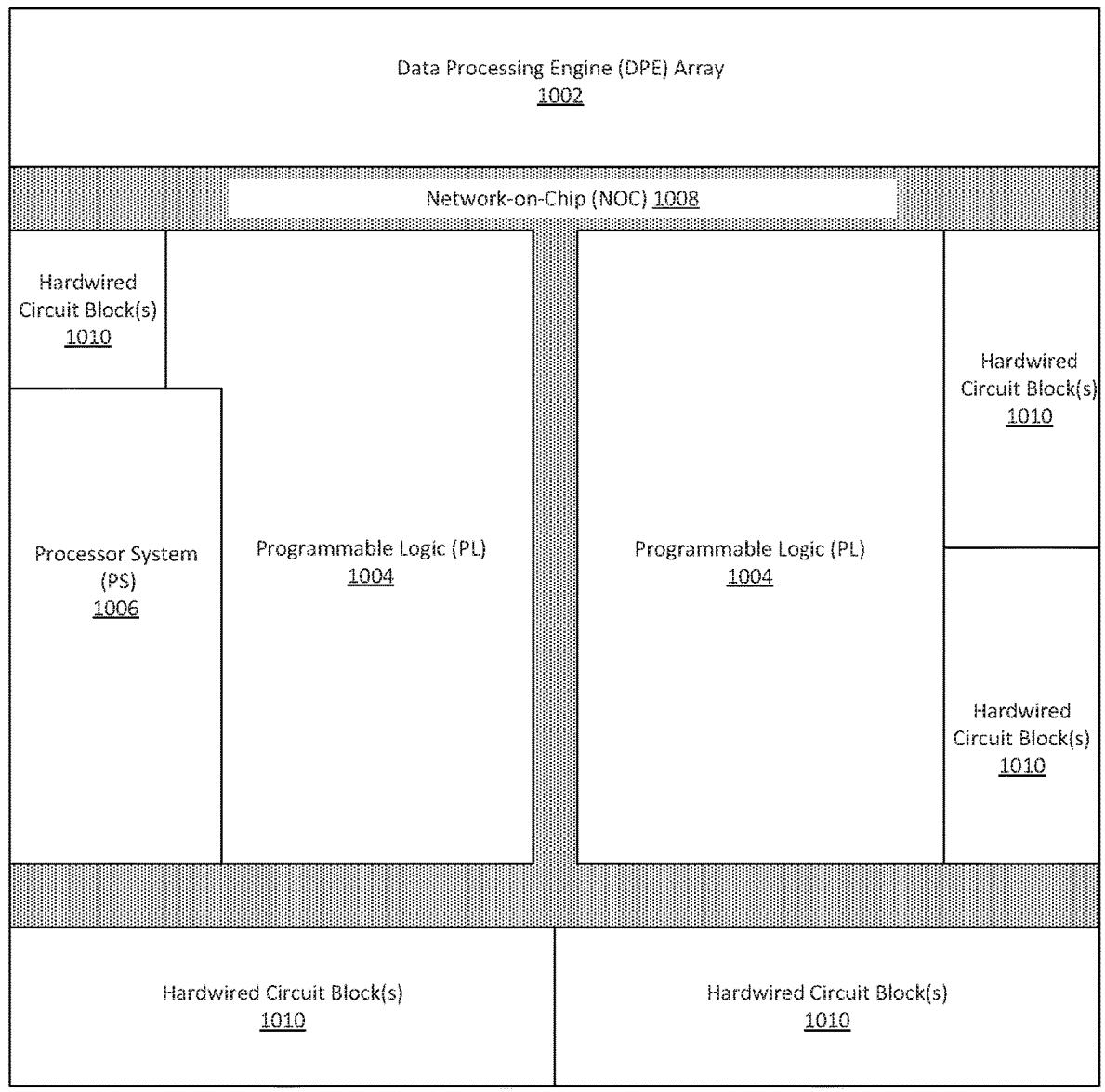
FIG. 10 depicts an exemplary System-on-Chip (SOC) on which the disclosed circuits, methods and processes may be implemented.

FIG. 10 depicts an exemplary System-on-Chip (SOC) on which the disclosed circuits, methods and processes may be implemented. SOC 1000 is an example of a programmable IC and an integrated programmable device platform. In the example of FIG. 10, the various, different subsystems or regions of the SOC 1000 illustrated may be implemented on a single die provided within a single integrated package. In other examples, the different subsystems may be implemented on a plurality of interconnected dies provided as a single, integrated package.

In the example, the SOC 1000 includes a plurality of regions having circuitry with different functionalities. In the example, the SOC 1000 optionally includes a data processing engine (DPE) array 1002. SOC 1000 includes programmable logic (PL) regions 1004 (hereafter PL region(s) or PL), a processing system (PS) 1006, a Network-on-Chip (NOC) 1008, and one or more hardwired circuit blocks 1010. DPE array 1002 is implemented as a plurality of interconnected, hardwired, and programmable processors having an interface to the other regions of the SOC 1000.

PL 1004 is circuitry that may be programmed to perform specified functions. As an example, PL 1004 may be implemented as field programmable gate array type of circuitry. PL 1004 can include an array of programmable circuit blocks. Examples of programmable circuit blocks within PL 1004 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 1004 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 1006 is implemented as hardwired circuitry that is fabricated as part of the SOC 1000. The PS 1006 may be implemented as, or include, any of a variety of different processor types each capable of executing program code. For example, PS 1006 may be implemented as an individual processor, e.g., a single core capable of executing program code. In another example, PS 1006 may be implemented as a multicore processor. In still another example, PS 1006 may include one or more cores, modules, co-processors, interfaces, and/or other resources. PS 1006 may be implemented using any of a variety of different types of architectures. Example architectures that may be used to implement PS 1006 may include, but are not limited to, an ARM processor architecture, an x86 processor architecture, a GPU architecture, a mobile processor architecture, a DSP architecture, or other suitable architecture that is capable of executing computer-readable instructions or program code.

NOC 1008 includes an interconnecting network for sharing data between endpoint circuits in SOC 1000. The endpoint circuits can be disposed in DPE array 1002, PL regions 1004, PS 1006, and/or in hardwired circuit blocks 1010. NOC 1008 can include high-speed data paths with dedicated switching. In an example, NOC 1008 includes horizontal paths, vertical paths, or both horizontal and vertical paths. The arrangement and number of regions shown in FIG. 10 is merely an example. The NOC 1008 is an example of the common infrastructure that is available within the SOC 1000 to connect selected components and/or subsystems.

NOC 1008 provides connectivity to PL 1004, PS 1006, and to selected ones of the hardwired circuit blocks 1010. NOC 1008 is programmable. In the case of a programmable NOC used with other programmable circuitry, the nets that are to be routed through NOC 1008 are unknown until a user circuit design is created for implementation within the SOC 1000. NOC 1008 may be programmed by loading configuration data into internal configuration registers that define how elements within NOC 1008 such as switches and interfaces are configured and operate to pass data from switch to switch and among the NOC interfaces.

NOC 1008 is fabricated as part of the SOC 1000 and while not physically modifiable, may be programmed to establish connectivity between different master circuits and different slave circuits of a user circuit design. NOC 1008, for example, may include a plurality of programmable switches that are capable of establishing packet switched network connecting user specified master circuits and slave circuits. In this regard, NOC 1008 is capable of adapting to different circuit designs, where each different circuit design has different combinations of master circuits and slave circuits implemented at different locations in the SOC 1000 that may be coupled by NOC 1008. NOC 1008 may be programmed to route data, e.g., application data and/or configuration data, among the master and slave circuits of the user circuit design. For example, NOC 1008 may be programmed to couple different user-specified circuitry implemented within PL 1004 with PS 1006, and/or DPE array 1002, with different hardwired circuit blocks, and/or with different circuits and/or systems external to the SOC 1000.

The hardwired circuit blocks 1010 may include input/output (I/O) blocks, and/or transceivers for sending and receiving signals to circuits and/or systems external to SOC 100, memory controllers, or the like. Examples of different I/O blocks may include single-ended and pseudo differential I/Os and high-speed differentially clocked transceivers. Further, the hardwired circuit blocks 1010 may be implemented to perform specific functions. Examples of hardwired circuit blocks 1010 include, but are not limited to, cryptographic engines, digital-to-analog converters, analog-to-digital converters, and the like. The hardwired circuit blocks 1010 within the SOC 1000 may be referred to herein from time-to-time as application-specific blocks.

In the example of FIG. 10, PL 1004 is shown in two separate regions. In another example, PL 1004 may be implemented as a unified region of programmable circuitry. In still another example, PL 1004 may be implemented as more than two different regions of programmable circuitry. The particular organization of PL 1004 is not intended as a limitation. In this regard, SOC 1000 includes one or more PL regions 1004, PS 1006, and NOC 1008. DPE array 1002 may be optionally included.

In other example implementations, the SOC 1000 may include two or more DPE arrays 1002 located in different regions of the IC. In still other examples, the SOC 1000 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments have been described with reference to the figures, other embodiments are possible. For example, the sub sampling front-end circuit 801 is a generalized structure, some sampling front-end circuits may omit some elements in the generalized structure. For example, some sampling front-end circuits may omit capacitors in one or more of the regular track-and-hold circuits. Some sampling front-end circuits may also omit one or more switches of the $(K+1)*(M+1)$ switches in the third sampling layer of circuits Rank 3'. Some sampling front-end circuits may also omit one or more resettable capacitors.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit comprising:
   a first sampling layer comprising:
      a first voltage buffer configured to receive an analog input signal; and
      a first track-and-hold circuit electrically coupled to an output node of the first voltage buffer;
   a second sampling layer comprising:
      a first integrating buffer electrically coupled to an output node of the first track-and-hold circuit, and comprising a first capacitor and a first switch connected to each other in parallel; and
      a first analog-to-digital converter (ADC) electrically coupled to an output node of the first integrating buffer.

2. The circuit of claim 1, wherein the first integrating buffer comprises a transconductor.

3. The circuit of claim 2, wherein an output node of the transconductor is coupled to a first terminal of the first capacitor, and a second terminal of the first capacitor is coupled to a finite impedance voltage source.

4. The circuit of claim 1, wherein the first sampling layer further comprises a second track-and-hold circuit electrically coupled to the output node of the first voltage buffer, and
   wherein the second sampling layer further comprises a second integrated buffer electrically coupled to an output node of the second track-and-hold circuit, and comprising a second capacitor and a second switch connected to each other in parallel.

5. The circuit of claim 1, wherein the analog input signal is a differential signal.

6. A circuit comprising:
   a first buffer configured to receive an analog input signal;
   a second buffer configured to receive the analog input signal;
   a first switch electrically coupled to an output node of the first buffer;
   a second switch electrically coupled an output node of the second buffer; and
   a first integrating buffer comprising an input node electrically coupled to the first switch, and comprising a first capacitor and a third switch connected to each other in parallel.

7. The circuit of claim 6, wherein the integrating buffer comprises a transconductor.

8. The circuit of claim 7, wherein an output node of the transconductor is coupled to a first terminal of the first capacitor, and a second terminal of the first capacitor is coupled to a finite impedance voltage source.

9. The circuit of claim 6 further comprising a second integrating buffer comprising an input node electrically coupled to the second switch, and a second capacitor and a fourth switch connected to each other in parallel.

10. The circuit of claim 6 further comprising a first analog-to-digital converter (ADC) electrically coupled to an output node of the first integrating buffer.

11. The circuit of claim 6 further comprising a second capacitor electrically coupled between the first switch and the first integrating buffer, wherein the first switch and the second capacitor form a first track-and-hold circuit.

12. The circuit of claim 6 further comprising:
   a fourth switch electrically coupled to the output node of the first buffer; and
   a second integrating buffer comprising an input node electrically coupled to the fourth switch, and a second capacitor and a fifth switch connected to each other in parallel.

13. The circuit of claim 12 further comprising a second ADC electrically coupled to an output node of the second integrating buffer.

14. The circuit of claim 12, wherein the second integrating buffer further comprises a transconductor.

15. The circuit of claim 12 further comprising a third capacitor electrically coupled between the fourth switch and the second integrating buffer, wherein the fourth switch and the third capacitor form a second track-and-hold circuit.

16. A method comprising:
   configuring each buffer of a plurality of buffers to receive an analog input signal;
   electrically coupling each switch of a plurality of switches to an output node of a corresponding buffer of the plurality of buffers;
   providing a first integrating buffer comprising a first capacitor and a first switch connected to each other in parallel; and
   electrically coupling the first integrating buffer to a second switch of the plurality of switches.

17. The method of claim 16, wherein the first integrating buffer comprises a transconductor.

18. The method of claim 16 further comprising:
   providing a second integrating buffer comprising a second capacitor and a third switch connected to each other in parallel; and
   electrically coupling the second integrating buffer to a fourth switch of the plurality of switches.

19. The method of claim 16, further comprising:
providing a second capacitor; and
electrically coupling the second capacitor to the second switch in series to form a first track-and-hold circuit.

20. The method of claim 16 further comprising:
providing an analog-to-digital converter (ADC); and
electrically coupling the ADC to an output node of the first integrating buffer.

* * * * *

UNITED STATES PATENT AND TRADEMARK OFFICE
CERTIFICATE OF CORRECTION

| | | |
|---|---|---|
| PATENT NO. | : 10,911,060 B1 | Page 1 of 1 |
| APPLICATION NO. | : 16/683854 | |
| DATED | : February 2, 2021 | |
| INVENTOR(S) | : Pedro Wilson De Abreu Farias Neto | |

It is certified that error appears in the above-identified patent and that said Letters Patent is hereby corrected as shown below:

In the Specification

Column 2, Line 52, Delete "KIM" and insert -- K*M --, therefor.

Column 2, Line 55, Delete "KIM" and insert -- K*M --, therefor.

Column 2, Line 63, Delete "KIM" and insert -- K*M --, therefor.

Column 2, Line 63-64, Delete "N 1." and insert -- N≥1. --, therefor.

Column 3, Line 23, Delete "KIM" and insert -- K*M --, therefor.

Column 3, Line 26, Delete "KIM" and insert -- K*M --, therefor.

Column 5, Line 26, Delete "10B" and insert -- IOB --, therefor.

Column 16, Line 60, Delete "KIM" and insert -- K*M --, therefor.

Column 17, Line 5, Delete "KIM" and insert -- K*M --, therefor.

Column 17, Line 6, Delete "KIM" and insert -- K*M --, therefor.

Column 17, Line 21, Delete "KIM" and insert -- K*M --, therefor.

Column 17, Line 32, Delete "KIM" and insert -- K*M --, therefor.

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*